(12) United States Patent
Takahashi et al.

(10) Patent No.: US 8,278,974 B2
(45) Date of Patent: Oct. 2, 2012

(54) DIVIDER CIRCUIT

(75) Inventors: Kei Takahashi, Isehara (JP); Yoshiaki Ito, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/078,219

(22) Filed: Apr. 1, 2011

(65) Prior Publication Data

US 2011/0249786 A1   Oct. 13, 2011

(30) Foreign Application Priority Data

Apr. 9, 2010   (JP) ................................. 2010-090296

(51) Int. Cl.
*H03K 21/00* (2006.01)
(52) U.S. Cl. .......................... 327/115; 327/117; 327/118
(58) Field of Classification Search .................... 327/48, 327/115, 117, 118; 377/47, 48
See application file for complete search history.

(56) References Cited

U.S. PATENT DOCUMENTS

| | | | |
|---|---|---|---|
| 6,813,332 B2 | 11/2004 | Nagao et al. | |
| 7,116,748 B2 | 10/2006 | Nagao et al. | |
| 7,268,756 B2 | 9/2007 | Koyama et al. | |
| 7,459,948 B2 | 12/2008 | Seethamraju | |
| 7,656,204 B2 | 2/2010 | Henzler et al. | |
| 7,674,650 B2 | 3/2010 | Akimoto et al. | |
| 7,680,238 B2 | 3/2010 | Lin | |
| 7,732,819 B2 | 6/2010 | Akimoto et al. | |
| 7,800,451 B2 | 9/2010 | Fu et al. | |
| 7,932,888 B2 | 4/2011 | Miyake | |
| 7,948,279 B2 * | 5/2011 | Lin ............................. | 327/115 |
| 2004/0140839 A1 | 7/2004 | Nagao et al. | |
| 2005/0062515 A1 | 3/2005 | Nagao et al. | |
| 2006/0280279 A1 | 12/2006 | Nagao et al. | |
| 2008/0258998 A1 | 10/2008 | Miyake | |
| 2008/0308805 A1 | 12/2008 | Akimoto et al. | |
| 2008/0308806 A1 | 12/2008 | Akimoto et al. | |
| 2009/0008639 A1 | 1/2009 | Akimoto et al. | |
| 2009/0239335 A1 | 9/2009 | Akimoto et al. | |

(Continued)

FOREIGN PATENT DOCUMENTS

JP    05-048432 A    2/1993
(Continued)

OTHER PUBLICATIONS

International Search Report (Application No. PCT/JP2011/057496) Dated May 17, 2011.

(Continued)

*Primary Examiner* — Hai L Nguyen
(74) *Attorney, Agent, or Firm* — Eric J. Robinson; Robinson Intellectual Property Law Office, P.C.

(57) ABSTRACT

A divider circuit includes a shift register which generates 2X (X is a natural number greater than or equal to 2) pulse signals in accordance with a first clock signal or a second clock signal and outputs them, and a divided signal output circuit which generates a signal to be a third clock signal with a cycle X times longer than a cycle of the first clock signal in accordance with the 2X pulse signals and outputs it. The divided signal output circuit includes X first transistors which control whether voltage of the signal to be the third clock signal is set to first voltage; and X second transistors which control whether voltage of the signal to be the third clock signal is set to second voltage.

20 Claims, 11 Drawing Sheets

U.S. PATENT DOCUMENTS

2009/0305461 A1 12/2009 Akimoto et al.
2010/0136743 A1 6/2010 Akimoto et al.
2010/0253397 A1 10/2010 Badillo

FOREIGN PATENT DOCUMENTS

| JP | 2004-226429 A | 8/2004 |
| JP | 2007-096055 A | 4/2007 |
| JP | 2008-122939 A | 5/2008 |
| JP | 2010-049791 A | 3/2010 |

OTHER PUBLICATIONS

Written Opinion (Application No. PCT/JP2011/057496) Dated May 17, 2011.

* cited by examiner

DIVIDER CIRCUIT

TECHNICAL FIELD

One embodiment of the present invention relates to a divider circuit.

BACKGROUND ART

In recent years, a divider circuit has been used for driving a digital circuit with the use of a plurality of clock signals each with a different cycle from each other.

As an example of a conventional divider circuit, a divider circuit including a flip-flop can be given (e.g., Patent Document 1).

REFERENCE

Patent Document

[Patent Document 1] Japanese Published Patent Application No. H05-048432

DISCLOSURE OF INVENTION

For example, although the conventional divider circuit including a flip-flop, which is disclosed in Patent Document 1, can have a simple circuit configuration, a malfunction might occur in the case where a clock signal with a short cycle is divided. For example, since the conventional divider circuit including a flip-flop generates an output signal by selectively outputting power supply voltage, operation speed is slow, and in the case where a clock signal with a short cycle is generated by the divider circuit, a malfunction might occur and a clock signal is not generated in some cases.

One embodiment of the present invention is to prevent a malfunction in dividing operation of a divider circuit.

According to one embodiment of the present invention, generated is a plurality of pulse signals which are voltage signals each having a value set in accordance with voltage of an input clock signal, and generated is a clock signal with a cycle N times (N is a natural number greater than or equal to 2) longer than a cycle of the input clock signal, with the use of the plurality of generated pulse signals.

One embodiment of the present invention is a divider circuit including a shift register which is supplied with a first clock signal and a second clock signal, generates 2X (X is a natural number greater than or equal to 2) pulse signals sequentially outputting pulses, in accordance with the first clock signal and the second clock signal, and outputs the generated 2X pulse signals; and a divided signal output circuit which generates a signal to be a third clock signal with a cycle X times longer than a cycle of the first clock signal, in accordance with the 2X pulse signals, and outputs the generated signal to be the third clock signal. The divided signal output circuit includes X first transistors each having a source, a drain, and a gate, in which different pulse signal among the first to X-th pulse signals of the 2X pulse signals is input to the respective gates of the X first transistors. In other words, the first to X-th pulse signals among the 2X pulse signals are separately input to the respective gates of the X first transistors. The X first transistors control whether voltage of a signal to be the third clock signal is set to first voltage; and X second transistors each having a source, a drain, and a gate, in which different pulse signal among the (X+1)-th to 2X-th pulse signals of the 2X pulse signals is input to the respective gates of the X second transistors. In other words, the (X+1)-th to 2X-th pulse signals of the 2X pulse signals are separately input to the respective gates of the X second transistors. The X second transistors control whether voltage of the signal to be the third clock signal is set to second voltage.

One embodiment of the present invention is a divider circuit including a first unit divider circuit which is supplied with a first clock signal and a second clock signal and generates a third clock signal with a cycle X times (X is a natural number greater than or equal to 2) longer than a cycle of the first clock signal; and a second unit divider circuit which is supplied with the third clock signal and generates a fourth clock signal with a cycle K times (K is a natural number greater than or equal to 2) longer than the cycle of the third clock signal in accordance with the third clock signal. The first unit divider circuit includes a shift register which generates 2X (X is a natural number greater than or equal to 2) pulse signals sequentially outputting pulses, in accordance with the first clock signal and the second clock signal, and outputs the generated 2X pulse signals; and a divided signal output circuit which generates a voltage signal in accordance with the (2×X) pulse signals, and outputs the generated voltage signal as the third clock signal. The divided signal output circuit includes X first transistors each having a source, a drain, and a gate, in which different pulse signal among the first to X-th pulse signals of the 2X pulse signals is input to the respective gates of the X first transistors. In other words, the first to X-th pulse signals among the 2X pulse signals are separately input to the respective gates of the X first transistors. The X first transistors control whether voltage of the voltage signal is set to first voltage, and X second transistors each having a source, a drain, and a gate, in which different pulse signal among the (X+1)-th to 2X-th pulse signals of the 2X pulse signals is input to the respective gates of the X second transistors. In other words, the (X+1)-th to 2X-th pulse signals of the 2X pulse signals are separately input to the respective gates of the X second transistors. The X second transistors control whether voltage of the voltage signal is set to second voltage.

According to one embodiment of the present invention, a malfunction can be prevented even in operation of dividing a clock signal with a short cycle.

BEST MODE FOR CARRYING OUT THE INVENTION

Hereinafter, examples of embodiments of the present invention will be described with reference to the drawings. Note that the present invention is not limited to the following description and it will be easily understood by those skilled in the art that modes and details can be modified in various ways without departing from the spirit and the scope of the present invention. Therefore, the present invention should not be interpreted as being limited to the description of the embodiments to be given below.

Note that contents of the embodiments can be combined with or replaced with each other as appropriate.

Embodiment 1

In this embodiment, a divider circuit including a shift register will be described.

Figure 1:
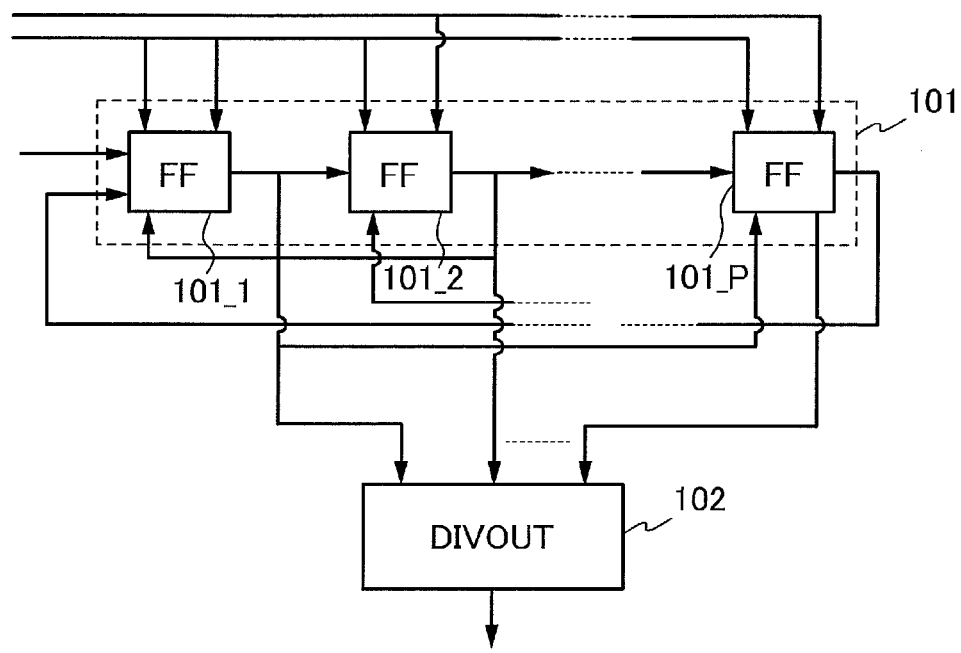
FIG. 1 is a block diagram illustrating an example of a structure of a divider circuit in Embodiment 1.

A structure of the divider circuit of this embodiment will be described with reference to FIG. 1. FIG. 1 is a block diagram illustrating an example of the structure of the divider circuit of this embodiment.

The divider circuit illustrated in FIG. 1 includes a shift register 101 and a divided signal output circuit (also referred to as DIVOUT) 102.

A clock signal is input to the shift register 101. For example, a clock signal CLK1 (also referred to as a signal CLK1) and a clock signal CLK2 (also referred to as a signal CLK2) are input to the shift register 101 as the clock signal. Further, the shift register 101 outputs 2X (X is a natural number greater than or equal to 2) pulse signals.

As a signal in the divider circuit of this embodiment, for example, a signal with voltage can be used. As the signal with voltage (also referred to as a voltage signal), an analog signal or a digital signal, which has at least first voltage and second voltage, can be used. For example, a binary digital signal such as a clock signal becomes at a low level and a high level, thereby having the first voltage (low-level voltage) and the second voltage (high-level voltage). Further, each of the high-level voltage and the low-level voltage preferably has a fixed value. However, since noise or the like has an influence on an electronic circuit, each of the high-level voltage and the low-level voltage does not necessarily have a fixed value and may have a value within a fixed range where a value can be seen as substantially equivalent. Further, as the signal in the divider circuit of this embodiment, a signal having first to third voltages may be used. As the third voltage, for example, voltage higher than or equal to the second voltage can be used.

Note that voltage generally refers to a difference between potentials at two points (also referred to as a potential difference). However, values of both a voltage and a potential are represented using volt (V) in a circuit diagram or the like in some cases, so that it is difficult to discriminate between them. Thus, in this specification, a potential difference between a potential at one point and a reference potential is sometimes used as a voltage at the point unless otherwise specified.

The signal CLK1 and the signal CLK2 are clock signals whose waveforms are different from each other by a ½ cycle.

The shift register 101 includes sequential circuits (also referred to as FFs) (sequential circuits 101_1 to 101_P) of P (P=2×X) stages, which includes P sequential circuits.

The signal CLK1 or the signal CLK2 is input to the sequential circuits. Further, the sequential circuits output a signal having voltage set in accordance with the input clock signal as an output signal. The sequential circuit includes a transistor for controlling voltage of the output signal, for example.

Note in the divider circuit, the transistor includes at least a source, a drain, and a gate unless otherwise specified.

A source refers to a source region, part of or the whole of a source electrode, or part of or the whole of a source wiring. A conductive layer having a function of both a source electrode and a source wiring is referred to as a source in some cases without distinction between a source electrode and a source wiring.

A drain refers to a drain region, part of or the whole of a drain electrode, or part of or the whole of a drain wiring. A conductive layer having a function of both a drain electrode and a drain wiring is referred to as a drain in some cases without distinction between a drain electrode and a drain wiring.

A gate refers to part of or the whole of a gate electrode, or part of or the whole of a gate wiring. A conductive layer having a function of both a gate electrode and a gate wiring is referred to as a gate in some cases without distinction between a gate electrode and a gate wiring.

A source and a drain of a transistor interchange with each other depending on a structure, an operation condition, or the like of a transistor in some cases.

As a transistor in the divider circuit, a transistor having a semiconductor layer including a semiconductor (e.g., silicon) belonging to Group 14 of the periodic table or an oxide semiconductor layer can be used, for example. The semiconductor layer including a semiconductor belonging to Group 14 or the oxide semiconductor layer has a function of a channel formation layer of a transistor. The oxide semiconductor layer is highly purified to be an intrinsic (also referred to as I-type) or substantially intrinsic semiconductor layer. Note that the high purification means at least one of the following concepts: removal of hydrogen from an oxide semiconductor layer as much as possible; and reduction of defects, which are caused by oxygen deficiency in an oxide semiconductor layer, by supply of oxygen to the oxide semiconductor layer. Further, all transistors included in the divider circuit can have the same conductivity type. When all the transistors have the same conductivity type, a manufacturing process can be simplified as compared to the case where transistors with different conductivity types are used.

The sequential circuit sets the voltage of the output signal in accordance with the voltage of the clock signal in such a manner that a transistor for controlling the voltage of the output signal of the sequential circuit is turned on. For example, in the sequential circuit in the odd-numbered stage, the transistor for controlling the voltage of the output signal sets the voltage of the output signal in accordance with the signal CLK1. In the sequential circuit in the even-numbered stage, the transistor for controlling the voltage of the output signal sets the voltage of the output signal in accordance with the signal CLK2. In the transistor for controlling the voltage of the output signal, capacitance is between the gate and either the source or the drain. Therefore, in the sequential circuit, the voltage of the gate of the transistor can be set higher than or equal to power supply voltage. Accordingly, it takes shorter time to set the voltage of the output signal to a desired value, and at least part of the voltage of the output signal can be higher than or equal to the power supply voltage. As the capacitance between the gate and either the source or the drain, parasitic capacitance, a capacitor which is additionally provided, or the like can be used.

The 2X pulse signals are input to the divided signal output circuit 102. The divided signal output circuit 102 has a function of generating a signal to be a signal CLK3 with a cycle X times longer than the cycle of the signal CLK1 in accordance with the input 2X pulse signals, and outputting the generated signal to be the signal CLK3 as an output signal. Note that generation of a signal with a cycle X times longer than the cycle of the signal CLK1 is also referred to as frequency division.

The divided signal output circuit 102 includes at least X transistors Tr1 and X transistors Tr2.

Different pulse signal among the first to X-th pulse signals is input to the respective gates of the X transistors Tr1. In other words, the first to X-th pulse signals among the 2X pulse signals are separately input to the respective gates of the X transistors Tr1. The transistors Tr1 have a function of controlling whether the voltage of the signal to be the signal CLK3 in a predetermined period is set to the first voltage.

Different pulse signal among the (X+1)-th to 2X-th pulse signals is input to the respective gates of the X transistors Tr2. In other words, the (X+1)-th to 2X-th pulse signals of the 2X pulse signals are separately input to the respective gates of the X transistors Tr2. The transistors Tr2 have a function of controlling whether the voltage of the signal to be the signal CLK3 in a predetermined period is set to the second voltage.

An example of the divider circuit of this embodiment includes a shift register and a divided signal output circuit. The shift register has a function of outputting 2X pulse signals in accordance with a first clock signal and a second clock signal. The divided signal output circuit sets voltage of a signal to be a third clock signal in such a manner that X first transistors and X second transistors are sequentially turned on in accordance with the 2X pulse signals, and thus outputs the third clock signal with a cycle X times longer than a cycle of the first clock signal. In the shift register in the divider circuit of this embodiment, it takes shorter time to set the voltage of the pulse signal to a desired value. This is because the voltage of the pulse signal to be an output signal is set in accordance with the voltage of the clock signal, for example. Accordingly, with the use of the shift register, operation speed of the divider circuit can be improved, and a malfunction in dividing operation can be prevented.

Embodiment 2

In this embodiment, an example of a structure of the divider circuit in the above Embodiment 1 will be described.

Figure 2A:
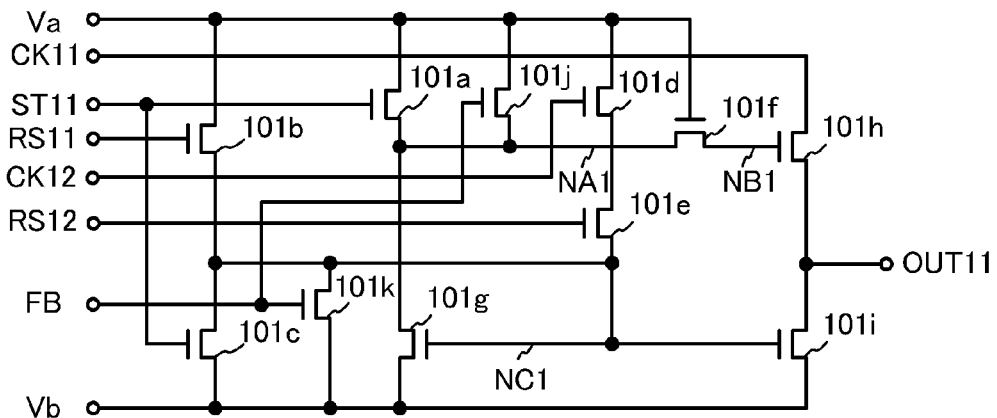
FIGS. 2A to 2C each illustrate an example of a structure of a shift register in a divider circuit in Embodiment 2.
Figure 2B:
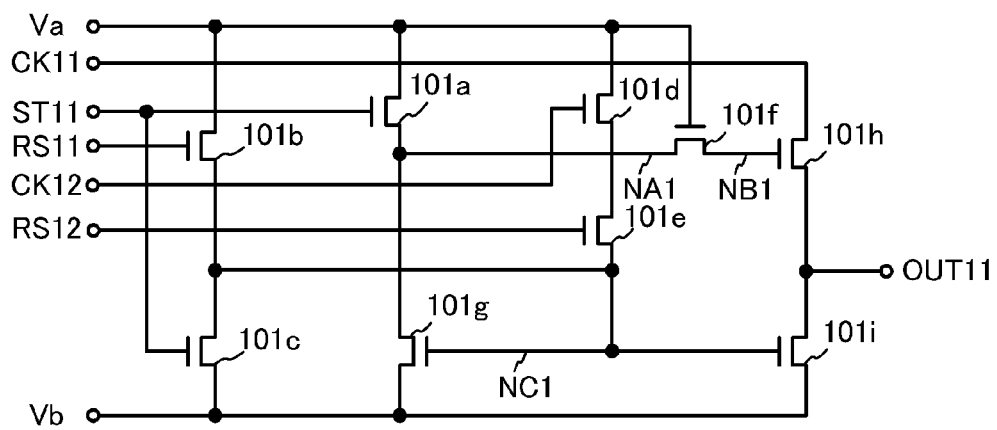
Figure 2C:
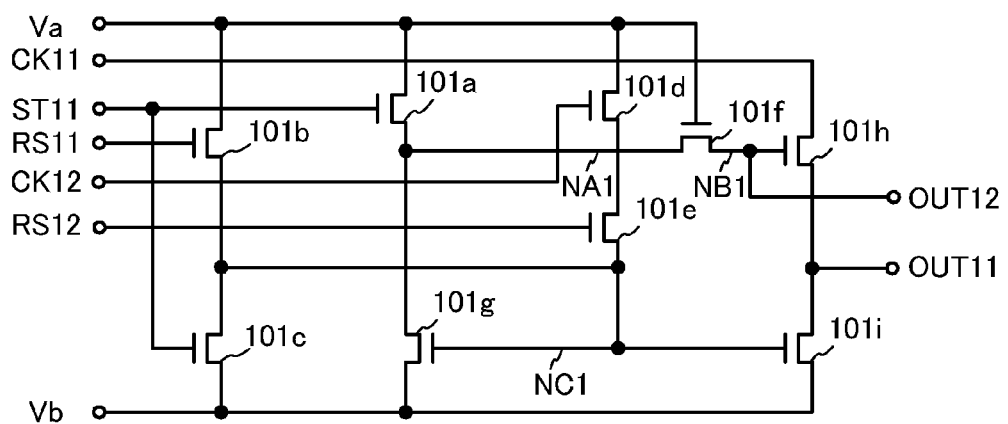

First, an example of a structure of each sequential circuit in the shift register of the divider circuit of the above embodiment will be described with reference to FIGS. 2A to 2C. FIGS. 2A to 2C each illustrate an example of a structure of the sequential circuit in the shift register of the divider circuit of this embodiment.

A set signal ST11 (also referred to as a signal ST11), a reset signal RS11 (also referred to as a signal RS11), a reset signal RS12 (also referred to as a signal RS12), a clock signal CK11 (also referred to as a signal CK11), a clock signal CK12 (also referred to as a signal CK12), and power supply voltage Vp are input to each sequential circuit. Further, each sequential circuit outputs an output signal OUT11 (also referred to as a signal OUT11).

FIG. 2A illustrates an example of a structure of a sequential circuit in the first stage. The sequential circuit illustrated in FIG. 2A includes transistors 101a to 101k.

Voltage Va is input to one of a source and a drain of the transistor 101a, and the signal ST11 is input to a gate of the transistor 101a.

The voltage Va is input to one of a source and a drain of the transistor 101b, and the signal RS11 is input to a gate of the transistor 101b.

One of a source and a drain of the transistor 101c is electrically connected to the other of the source and the drain of the transistor 101b, voltage Vb is input to the other of the source and the drain of the transistor 101c, and the signal ST11 is input to a gate of the transistor 101c.

Note that one of the voltage Va and the voltage Vb is to be high power supply voltage Vdd and the other of the voltage Va and the voltage Vb is to be low power supply voltage Vss. The high power supply voltage Vdd is relatively higher than the low power supply voltage Vss, and the low power supply voltage Vss is relatively lower than the high power supply voltage Vdd. Values of the voltage Va and the voltage Vb interchange depending on polarity of a transistor or the like in some cases. A potential difference between the voltage Va and the voltage Vb is power supply voltage Vp.

The voltage Va is input to one of a source and a drain of the transistor 101d, and the signal CK12 is input to a gate of the transistor 101d.

One of a source and a drain of the transistor 101e is electrically connected to the other of the source and the drain of the transistor 101d, the other of the source and the drain of the transistor 101e is electrically connected to the other of the source and the drain of the transistor 101b, and the signal RS12 is input to a gate of the transistor 101e.

One of a source and a drain of the transistor 101f is electrically connected to the other of the source and the drain of the transistor 101a, and the voltage Va is input to a gate of the transistor 101f. Note that a portion where the one of the source and the drain of the transistor 101f is connected to the other of the source and the drain of the transistor 101a is also referred to as a node NA1.

One of a source and a drain of the transistor 101g is electrically connected to the other of the source and the drain of the transistor 101a, the voltage Vb is input to the other of the source and the drain of the transistor 101g, and a gate of the transistor 101g is electrically connected to the other of the source and the drain of the transistor 101e.

The signal CK11 is input to one of a source and a drain of the transistor 101h, and a gate of the transistor 101h is electrically connected to the other of the source and the drain of the transistor 101f. Note that a portion where the gate of the transistor 101h is connected to the other of the source and the drain of the transistor 101f is also referred to as a node NB1.

One of a source and a drain of the transistor 101i is electrically connected to the other of the source and the drain of the transistor 101h, the voltage Vb is input to the other of the source and the drain of the transistor 101i, and a gate of the transistor 101i is electrically connected to the other of the source and the drain of the transistor 101e. Note that a portion where the gate of the transistor 101i, the other of the source and the drain of the transistor 101b, the one of the source and the drain of the transistor 101c, the other of the source and the drain of the transistor 101e, the gate of the transistor 101g, and one of a source and a drain of the transistor 101k are connected to one another is also referred to as a node NC1.

The voltage Va is input to one of a source and a drain of the transistor 101j, the other of the source and the drain of the transistor 101j is electrically connected to the other of the source and the drain of the transistor 101a, and a signal FB is input to a gate of the transistor 101j. The signal FB is a feedback signal, which is a signal OUT11 (also referred to as a signal OUT11(101_P)) of the sequential circuit 101_P in the P-th stage.

The one of the source and the drain of the transistor 101k is electrically connected to the other of the source and the drain of the transistor 101b, the voltage Vb is input to the other of the source and the drain of the transistor 101k, and the signal FB is input to a gate of the transistor 101k.

FIG. 2B illustrates an example of a structure of the sequential circuits in the second to ((P/2)+1)-th stages.

The sequential circuit illustrated in FIG. 2B has a structure, in which the transistor 101j and the transistor 101k are omitted from the structure of the sequential circuit illustrated in FIG. 2A. Therefore, the description of the example of the structure of the sequential circuit illustrated in FIG. 2A is employed as appropriate.

FIG. 2C illustrates an example of a structure of the sequential circuits in the ((P/2)+2)-th to P-th stages.

The sequential circuit illustrated in FIG. 2C has a structure in which voltage of the node NB1 is output as a signal OUT12, in addition to the structure of the sequential circuit illustrated in FIG. 2B. Therefore, the description of the sequential circuit illustrated in FIG. 2A is employed as appropriate for a portion having the structure same as the structure of the sequential circuit illustrated in FIG. 2B.

A start signal SP (also referred to as a signal SP) is input to the sequential circuit in the first stage as the signal ST11. The signal SP is a pulse signal.

The signal OUT11 of the sequential circuit in the Q-th (Q is a natural number greater than or equal to 1 and less than or equal to (P−1)) stage is input to the sequential circuit in the (Q+1)-th stage as the signal ST11.

The signal OUT11 of the sequential circuit in the (U+1)-th (U is a natural number greater than or equal to 1 and less than or equal to (P−1)) stage is input to the sequential circuit in the U-th stage as the signal RS11.

The signal OUT11 of the sequential circuit in the first stage is input to the sequential circuit in the P-th stage as the signal RS11.

To the sequential circuit in the even-numbered stage, the signal CLK2 is input as the signal CK11 and the signal CLK1 is input as the signal CK12.

To the sequential circuit in the odd-numbered stage, the signal CLK1 is input as the signal CK11 and the signal CK12.

A signal RST is input to each of the sequential circuits as the signal RS12. The signal RST is a pulse signal. Note that the signal SP can be generated with the use of the signal RST.

Figure 3A:
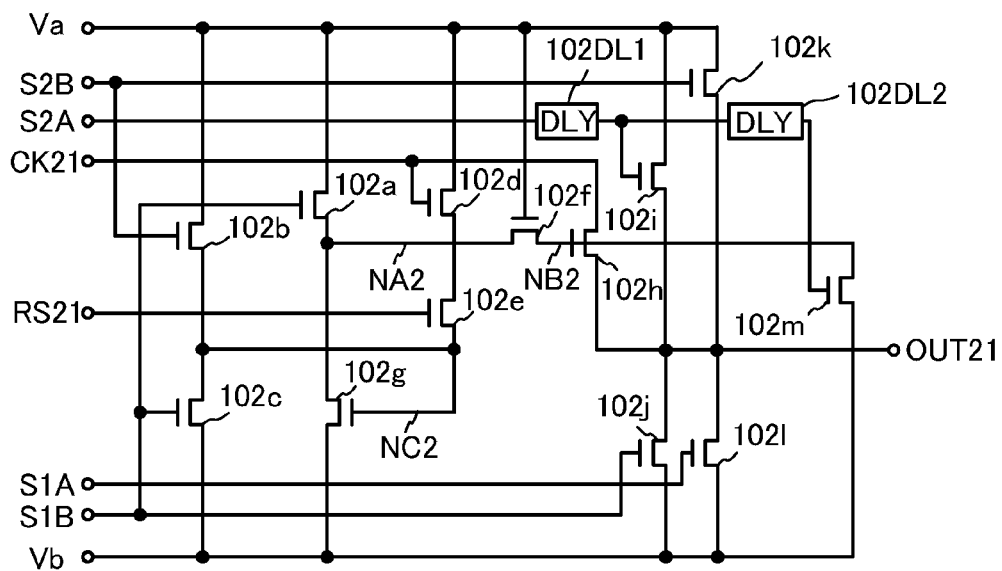
FIGS. 3A and 3B each illustrate an example of a structure of a divided signal output circuit in a divider circuit in Embodiment 2.
Figure 3B:
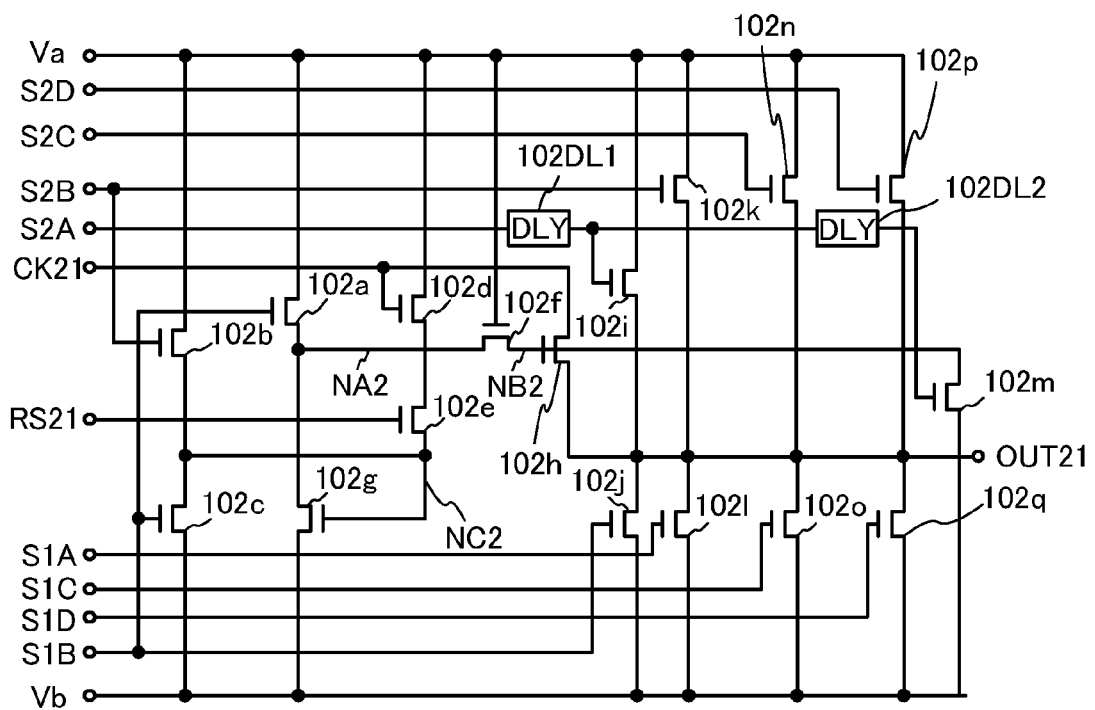

Next, an example of a structure of a divided signal output circuit in the divider circuit of this embodiment will be described with reference to FIGS. 3A and 3B. FIGS. 3A and 3B each illustrate an example of the structure of the divided signal output circuit in the divider circuit of this embodiment.

The divided signal output circuit illustrated in FIG. 3A is a divided signal output circuit in which a shift register includes sequential circuits of four stages. The divided signal output circuit illustrated in FIG. 3A includes transistors 102a to 102m, a delay circuit 102DL1, and a delay circuit 102DL2.

A signal S1A, a signal S1B, a signal S2A, a signal S2B, a clock signal CK21 (also referred to as a signal CK21), a reset signal RS21 (also referred to as a signal RS21), and power supply voltage Vp are input to the divided signal output circuit illustrated in FIG. 3A. Further, the divided signal output circuit illustrated in FIG. 3A outputs an output signal OUT21 (also referred to as a signal OUT21). The signal OUT21 is a clock signal in which frequency of the clock signal CLK1 is divided by N. That is, a cycle of the signal OUT21 is N times longer than a cycle of the clock signal CLK1.

Voltage Va is input to one of a source and a drain of the transistor 102a, and the signal S1B is input to a gate of the transistor 102a.

The voltage Va is input to one of a source and a drain of the transistor 102b, and the signal S2B is input to a gate of the transistor 102b.

One of a source and a drain of the transistor 102c is electrically connected to the other of the source and the drain of the transistor 102b, voltage Vb is input to the other of the source and the drain of the transistor 102c, and the signal S1B is input to a gate of the transistor 102c.

The voltage Va is input to one of a source and a drain of the transistor 102d, and the signal CK21 is input to a gate of the transistor 102d.

One of a source and a drain of the transistor 102e is electrically connected to the other of the source and the drain of the transistor 102d, and the other of the source and the drain of the transistor 102e is electrically connected to the other of the source and the drain of the transistor 102b, and the signal RS21 is input to a gate of the transistor 102e.

One of a source and a drain of the transistor 102f is electrically connected to the other of the source and the drain of the transistor 102a, and the voltage Va is input to a gate of the transistor 102f. Note that a portion where the one of the source and the drain of the transistor 102f is connected to the other of the source and the drain of the transistor 102a is also referred to as a node NA2.

One of a source and a drain of the transistor 102g is electrically connected to the other of the source and the drain of the transistor 102a, the voltage Vb is input to the other of the source and the drain of the transistor 102g, and a gate of the transistor 102g is electrically connected to the other of the source and the drain of the transistor 102b. Note that a portion where the gate of the transistor 102g, the other of the source and the drain of the transistor 102b, the one of the source and the drain of the transistor 102c, and the other of the source and the drain of the transistor 102e are connected to one another is also referred to as a node NC2.

The signal CK21 is input to one of a source and a drain of the transistor 102h, and a gate of the transistor 102h is electrically connected to the other of the source and the drain of the transistor 102f. Note that a portion where the gate of the transistor 102h is connected to the other of the source and the drain of the transistor 102f is also referred to as a node NB2.

The voltage Va is input to one of a source and a drain of the transistor 102i, the other of the source and the drain of the transistor 102i is electrically connected to the other of the source and the drain of the transistor 102h, and the signal S2A is input to a gate of the transistor 102i through the delay circuit 102DL1.

One of a source and a drain of the transistor 102j is electrically connected to the other of the source and the drain of the transistor 102h, the voltage Vb is input to the other of the source and the drain of the transistor 102j, and the signal S1B is input to a gate of the transistor 102j.

The voltage Va is input to one of a source and a drain of the transistor 102k, the other of the source and the drain of the transistor 102k is electrically connected to the other of the source and the drain of the transistor 102h, and the signal S2B is input to a gate of the transistor 102k.

One of a source and a drain of the transistor 102l is electrically connected to the other of the source and the drain of the transistor 102h, the voltage Vb is input to the other of the source and the drain of the transistor 102*l*, and the signal S1A is input to a gate of the transistor 102*l*.

One of a source and a drain of the transistor 102*m* is electrically connected to the other of the source and the drain of the transistor 102*f*; the voltage Vb is input to the other of the source and the drain of the transistor 102*m*, and the signal S2A is input to a gate of the transistor 102*m* through the delay circuit 102DL1 and the delay circuit 102DL2.

To the sequential circuit illustrated in FIG. 3A, the signal CLK1 is input as the signal CK21, the signal RST is input as the signal RS21, the signal OUT11 of the sequential circuit in the first stage in the shift register 101 (also referred to as a signal OUT11(101_1)) is input as the signal S1A, the signal OUT11 of the sequential circuit in the second stage in the shift register 101 (also referred to as a signal OUT11(101_2)) is input as the signal S1B, the signal OUT11 of the sequential circuit in the third stage in the shift register 101 (also referred to as a signal OUT11(101_3)) is input as the signal S2A, and the signal OUT12 of the sequential circuit 1014 in the fourth stage in the shift register 101 (also referred to as a signal OUT12(1014)) is input as the signal S2B.

The divided signal output circuit illustrated in FIG. 3B is a divided signal output circuit in which the shift register 101 includes sequential circuits of eight stages. The divided signal output circuit illustrated in FIG. 3B includes transistors 102*n* to 102*q* in addition to the structure of the divided signal output circuit illustrated in FIG. 3A, and a signal S1C, a signal S1D, a signal S2C, and a signal S2D are further input.

The voltage Va is input to one of a source and a drain of the transistor 102*n*, the other of the source and the drain of the transistor 102*n* is electrically connected to the other of the source and the drain of the transistor 102*h*, and the signal S2C is input to a gate of the transistor 102*n*.

One of a source and a drain of the transistor 102*o* is electrically connected to the other of the source and the drain of the transistor 102*h*, the voltage Vb is input to the other of the source and the drain of the transistor 102*o*, and the signal S1C is input to a gate of the transistor 102*o*.

The voltage Va is input to one of a source and a drain of the transistor 102*p*, the other of the source and the drain of the transistor 102*p* is electrically connected to the other of the source and the drain of the transistor 102*h*, and the signal S2D is input to a gate of the transistor 102*p*.

One of a source and a drain of the transistor 102*q* is electrically connected to the other of the source and the drain of the transistor 102*h*, the voltage Vb is input to the other of the source and the drain of the transistor 102*q*, and the signal S1D is input to a gate of the transistor 102*q*.

Further, to the divided signal output circuit illustrated in FIG. 3B, the signal CLK1 is input as the signal CK21, the signal RST is input as the signal RS21, the signal OUT11 of the sequential circuit in the first stage in the shift register 101 is input as the signal S1A, the signal OUT11 of the sequential circuit in the second stage in the shift register 101 is input as the signal S1B, the signal OUT11 of the sequential circuit in the third stage in the shift register 101 is input as the signal S1C, the signal OUT12 of the sequential circuit in the fourth stage in the shift register 101 is input as the signal S1D, the signal OUT11 of the sequential circuit in the fifth stage in the shift register 101 (also referred to as a signal OUT11(101_5)) is input as the signal S2A, the signal OUT12 of the sequential circuit in the sixth stage in the shift register 101 (also referred to as a signal OUT12(101_6)) is input as the signal S2B, the signal OUT12 of the sequential circuit in the seventh stage in the shift register 101 (also referred to as a signal OUT12(101_7)) is input as the signal S2C, and the signal OUT12 of the sequential circuit in the eighth stage in the shift register 101 (also referred to as a signal OUT12(101_8)) is input as the signal S2D.

Note that the delay circuit 102DL1 and the delay circuit 102DL2 are each formed using 2N (N is a natural number) invertors which are electrically connected in parallel, for example.

Next, an example of operation of the divider circuit of this embodiment will be described.

Figure 4A:
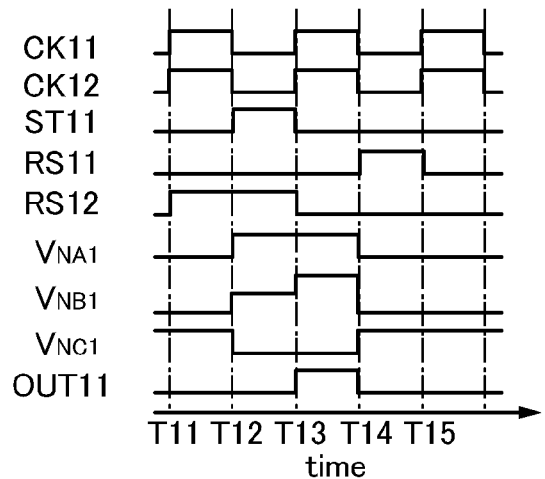
FIGS. 4A to 4C are timing charts each showing an example of operation of a shift register in a divider circuit in Embodiment 2.
Figure 4B:
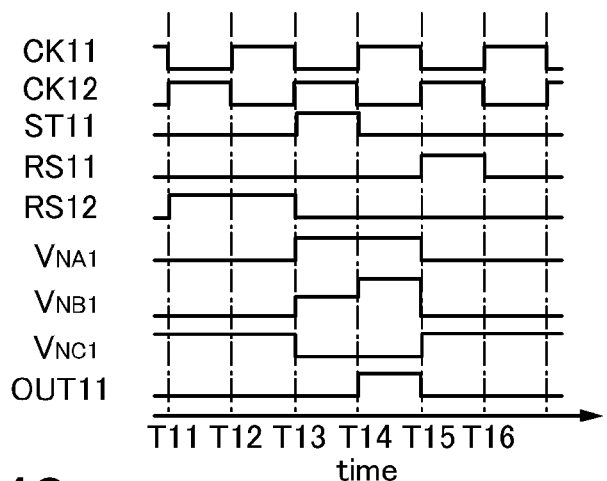
Figure 4C:
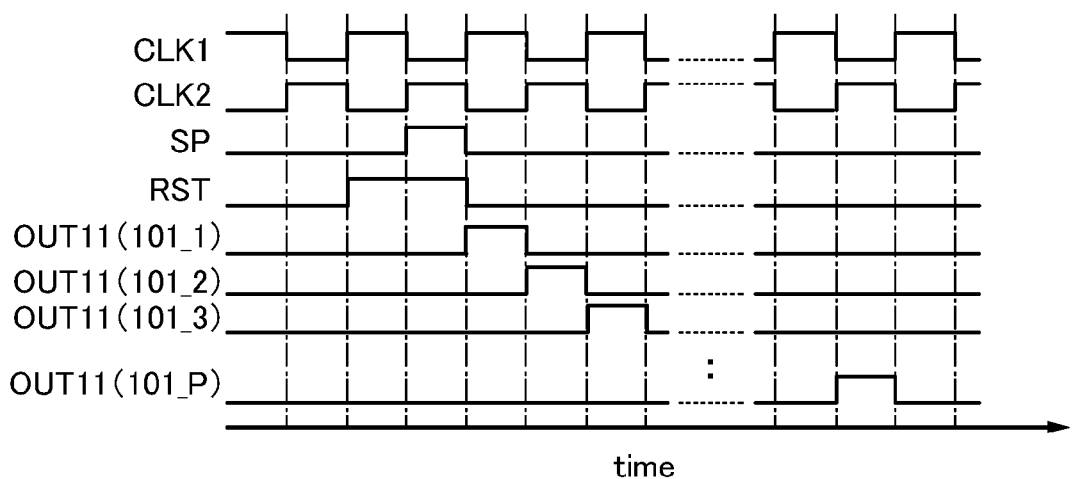

First, an example of operation of the shift register 101 in the divider circuit will be described with reference to FIGS. 4A to 4C. FIGS. 4A to 4C are timing charts each showing an example of operation of the shift register in the divider circuit of this embodiment. Note that here, as an example, all the transistors 101*a* to 101*i* have N-type conductivity, the high power supply voltage Vdd is input as the voltage Va, and the low power supply voltage Vss is input as the voltage Vb.

FIG. 4A is a timing chart showing an example of operation of the sequential circuit in the odd-numbered stage. In FIG. 4A, at a time T11, the signal CK11 and the signal CK12 are each set to a high level, the signal ST11 is at a low level, the signal RS11 is at a low level, and the signal RS12 is set to a high level.

At this time, the sequential circuit is set to a reset state. Further, the transistor 101*b* and the transistor 101*c* are turned off and the transistor 101*d* and the transistor 101*e* are turned on; therefore, voltage of the node NC1 (also referred to as $V_{NC1}$) becomes equivalent to the value of the voltage Va and the transistor 101*g* and the transistor 101*i* are turned on. In addition, the transistor 101*a* is turned off and the transistor 101*g* is in an on state; therefore, voltage of the node NA1 (also referred to as $V_{NA1}$) becomes equivalent to the value of the voltage Vb. Moreover, since the transistor 101*f* is in an on state, voltage of the node NB1 (also referred to as $V_{NB1}$) becomes equivalent to the value of the voltage Vb, and the transistor 101*h* is turned off. The transistor 101*h* is turned off and the transistor 101*i* is turned on, so that the signal OUT11 is set to a low level.

Next, at a time T12, the signal CK11 and the signal CK12 are each set to a low level, the signal ST11 is set to a high level, the signal RS11 remains at a low level, and the signal RS12 remains at a high level.

At this time, the sequential circuit is set to a set state. The transistor 101*b* remains off, the transistor 101*c* is turned on, the transistor 101*d* is turned off, and the transistor 101*e* remains on; therefore, the voltage of the node NC1 remains equivalent to the value of the voltage Vb and the transistor 101*g* and the transistor 101*i* are turned off Further, the transistor 101*a* is turned on and the transistor 101*g* is turned of therefore, the voltage of the node NA1 becomes equivalent to the value of the voltage Va. Moreover, since the transistor 101*f* is in an on state, the voltage of the node NB1 becomes equivalent to the value of the voltage Va, the transistor 101*h* is turned on, the voltage of the node NA1 and the voltage of the node NB1 become equivalent to the value of the voltage Va; accordingly, the transistor 101*f* is turned off. The transistor 101*h* is turned on and the transistor 101*i* is turned off, so that the signal OUT11 remains at a low level.

Next, at a time T13, the signal CK11 and the signal CK12 are each set to a high level, the signal ST11 is set to a low level, the signal RS11 remains at a low level, and the signal RS12 is set to a low level.

At this time, the transistor 101*b* remains off, the transistor 101*c* is turned off, the transistor 101*d* is turned on, and the transistor 101*e* is turned off; therefore, the voltage of the node NC1 remains equivalent to the value of the voltage Vb, and the transistor 101*g* and the transistor 101*i* remain off. Further, the transistor 101a is turned off and the transistor 101g remains off; therefore, the voltage of the node NA1 remains equivalent to the value of the voltage Va. The transistor 101f remains off and the node NB1 enters a floating state. The transistor 101h remains on and the transistor 101i remains off, so that the voltage of the other of the source and the drain of the transistor 101h is increased. Then, the voltage of the node NB1 is increased because of capacitive coupling due to parasitic capacitance generated between the gate of the transistor 101h and the other of the source and the drain of the transistor 101h. This is so-called bootstrap operation. The voltage of the node NB1 is increased to a value which is larger than the sum of the voltage Va and the threshold voltage of the transistor 101h (also referred to as $Vth_{101h}$), that is, $Va+Vth_{101h}+Vx$. At this time, the transistor 101h remains on. Further, the signal OUT11 is set to a high level.

Next, at a time T14, the signal CK11 and the signal CK12 are each set to a low level, the signal ST11 remains at a low level, the signal RS11 is set to a high level, and the signal RS12 remains at a low level.

At this time, the transistor 101b is turned on, the transistor 101c and the transistor 101e remain off, and the transistor 101d is turned off; therefore, the voltage of the node NC1 becomes equivalent to the value of the voltage Va, and the transistor 101g and the transistor 101i are turned on. Further, the transistor 101a remains off and the transistor 101g is turned on; therefore, the voltage of the node NA1 becomes equivalent to the value of the voltage Vb and the transistor 101f is turned on. Since transistor 101f is turned on, the voltage of the node NB1 becomes equivalent to the value of the voltage Vb and the transistor 101h is turned off. Since the transistor 101h is turned off and the transistor 101i is turned on, the signal OUT11 is set to a low level.

Thus, the sequential circuit in the odd-numbered stage outputs a pulse of the signal OUT11.

FIG. 4B is a timing chart showing an example of operation of the sequential circuit in the even-numbered stage. In FIG. 4B, at the time T11, the signal CK11 is set to a low level, the signal CK12 is set to a high level, the signal ST11 is set to a low level, the signal RS11 is set to a low level, and the signal RS12 is set to a high level.

At this time, the sequential circuit is set to a reset state. The transistor 101b and the transistor 101c are turned off, and the transistor 101d and the transistor 101e are turned on; therefore, the voltage of the node NC1 becomes equivalent to the value of the voltage Va, and the transistor 101g and the transistor 101i are turned on. Further, the transistor 101a is turned off and the transistor 101g is turned on; therefore, the voltage of the node NA1 becomes equivalent to the value of the voltage Vb. Since the transistor 101f is in an on state, the voltage of the node NB1 becomes equivalent to the value of the voltage Vb and the transistor 101h is turned off. The transistor 101h is turned off and the transistor 101i is turned on, so that the signal OUT11 is set to a low level.

Next, at the time T12, the signal CK11 is set to a high level, the signal CK12 is set to a low level, the signal ST11 remains at a low level, the signal RS11 remains at a low level, and the signal RS12 remains at a high level.

At this time, the transistor 101b and the transistor 101c remain off, the transistor 101e remains on, and the transistor 101d is turned off; therefore, the voltage of the node NC1 remains equivalent to the value of the voltage Va, and the transistor 101g and the transistor 101i remain on. Further, the transistor 101a remains off and the transistor 101g remains on; therefore, the voltage of the node NA1 remains equivalent to the value of the voltage Vb. Since the transistor 101f remains on, the voltage of the node NB1 remains equivalent to the value of the voltage Vb and the transistor 101h remains off. The transistor 101h remains off and the transistor 101i remains on, so that the signal OUT11 remains at a low level.

Next, at the time T13, the signal CK11 is set to a low level, the signal CK12 is set to a high level, the signal ST11 is set to a high level, the signal RS11 remains at a low level, and the signal RS12 is set to a low level.

At this time, the sequential circuit is set to a set state. The transistor 101b remains off, the transistor 101c is turned on, the transistor 101d is turned on, and the transistor 101e is turned off; therefore, the voltage of the node NC1 becomes equivalent to the value of the voltage Vb and the transistor 101g and the transistor 101i are turned off. Further, the transistor 101a is turned on and the transistor 101g is turned off; therefore, the voltage of the node NA1 becomes equivalent to the value of the voltage Va. Since the transistor 101f remains on, the voltage of the node NB1 becomes equivalent to the value of the voltage Va and the transistor 101h is turned on. When the voltage of the node NA1 and the voltage of the node NB1 become equivalent to the value of the voltage Va, the transistor 101f is turned off. The transistor 101h is turned on and the transistor 101i is turned off, so that the signal OUT11 remains at a low level.

Next, at the time T14, the signal CK11 is set to a high level, the signal CK12 is set to a low level, the signal ST11 is set to a low level, the signal RS11 remains at a low level, and the signal RS12 remains at a low level.

At this time, the transistor 101b and the transistor 101e remain off, and the transistor 101c and the transistor 101d are turned off; therefore, the voltage of the node NC1 remains equivalent to the value of the voltage Vb and the transistor 101g and the transistor 101i remain off. Further, the transistor 101a is turned off and the transistor 101g remains off; therefore, the voltage of the node NA1 remains equivalent to the value of the voltage Va. The transistor 101f remains off, the node NB1 enters a floating state, the transistor 101h remains on, and the transistor 101i remains off; therefore, the voltage of the other of the source and the drain of the transistor 101h is increased. Then, the voltage of the node NB1 is increased because of capacitive coupling due to parasitic capacitance generated between the gate of the transistor 101h and the other of the source and the drain of the transistor 101h. The voltage of the node NB1 is increased to a value which is larger than the sum of the voltage Va and the threshold voltage of the transistor 101h (also referred to as $Vth_{101h}$), that is, $Va+Vth_{101h}+Vx$. At this time, the transistor 101h remains on, and the transistor 101i remains off, so that the signal OUT11 is set to a high level.

Next, at a time T15, the signal CK11 is set to a low level, the signal CK12 is set to a high level, the signal ST11 remains at a low level, the signal RS11 is set to a high level, and the signal RS12 remains at a low level.

At this time, the transistor 101c and the transistor 101e remain off and the transistor 101b is turned on; therefore, the voltage of the node NC1 becomes equivalent to the value of the voltage Va, and the transistor 101g and the transistor 101i are turned on. Further, the transistor 101a remains off and the transistor 101g is turned on; therefore, the voltage of the node NA1 becomes equivalent to the value of the voltage Vb. Since the transistor 101f is turned on, the voltage of the node NB1 becomes equivalent to the value of the voltage Vb and the transistor 101h is turned off. The transistor 101h is turned off and the transistor 101i is turned on, so that the signal OUT11 is set to a low level.

Thus, the sequential circuit outputs a pulse of the signal OUT11.

Further, an example of operation of the sequential circuit illustrated in FIG. 2A will be described with the use of the description of the example of operation of the sequential circuit described with reference to FIG. 4A.

In the sequential circuit illustrated in FIG. 2A, in addition to the operation of the sequential circuit illustrated in FIG. 2B, the transistor 101*j* and the transistor 101*k* are turned on when a pulse of the signal FB is input. When the transistor 101*j* is turned on, the voltage of the node NA1 becomes equivalent to the value of the voltage Va and the transistor 101*f* is turned off. When the transistor 101*k* is turned on, the voltage of the node NB1 becomes equivalent to the value of the voltage Vb and the transistor 101*g* and the transistor 101*i* are turned off.

Further, operation of the sequential circuit illustrated in FIG. 2C is the same as the operation of the sequential circuit illustrated in FIG. 2B described above; therefore, the description of the example of the operation of the sequential circuit illustrated in FIG. 2B is employed as appropriate.

FIG. 4C is a timing chart showing an example of operation of the shift register illustrated in FIG. 1.

In FIG. 4C, first, a pulse of the signal RST is input, so that each sequential circuit is set to a reset state. Then, a pulse of the signal SP is input, so that the sequential circuit 101_1 in the first stage is set to a set state. In the next period, the sequential circuit 101_1 in the first stage outputs the pulse of the signal OUT11. Further, the pulse of the signal OUT11 of the sequential circuit 101_1 in the first stage is input to the sequential circuit 101_2 in the second stage as the set signal ST11, so that the sequential circuit 101_2 in the second stage is set to a set state. The sequential circuit 101_2 in the second stage outputs the pulse of the signal OUT11 in the next period. The above operation is sequentially performed in up to and including the sequential circuit 101_P in the P-th stage. Thus, the pulses of the signals OUT11 of the sequential circuit 101_1 in the first stage to the sequential circuit 101_P in the P-th stage are sequentially output. The above is an example of operation of the shift register in the divider circuit of this embodiment.

Figure 5:
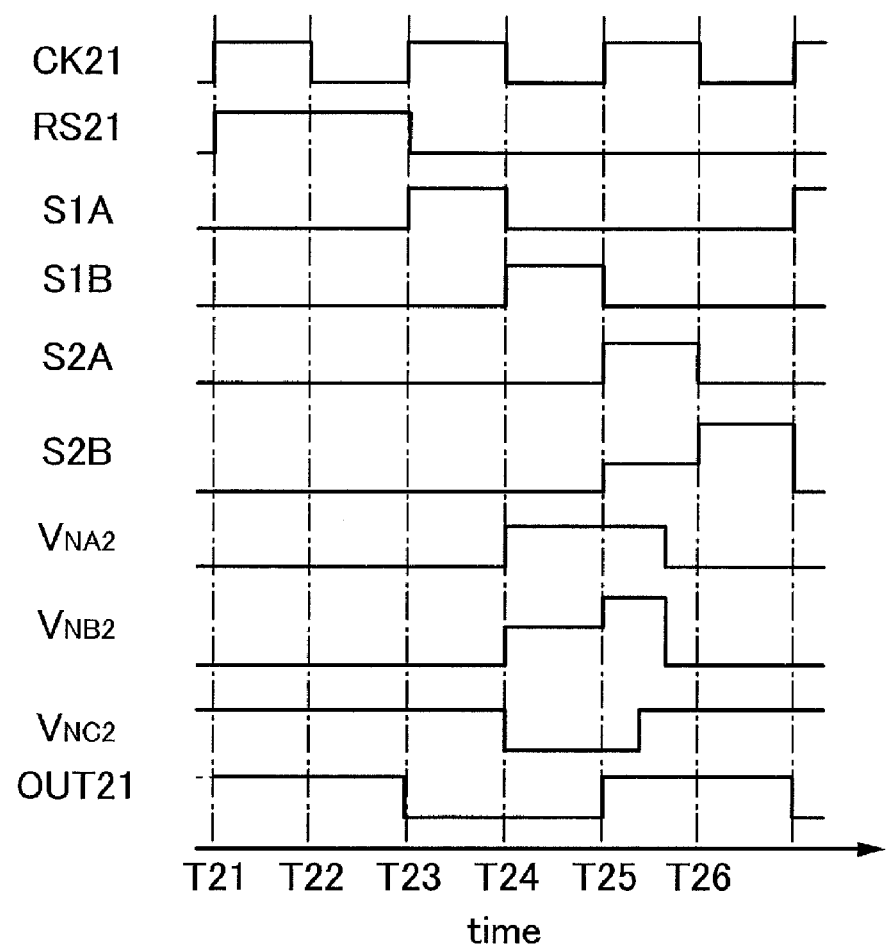
FIG. 5 is a timing chart showing an example of operation of a divided signal output circuit in a divider circuit in Embodiment 2.

Further, as an example of operation of a divided signal output circuit in a divider circuit of this embodiment, an example of operation of the divided signal output circuit having the structure illustrated in FIG. 3A will be described with reference to FIG. 5. FIG. 5 is a timing chart showing an example of operation of the divided signal output circuit having the structure illustrated in FIG. 3A.

In FIG. 5, at a time T21, the signal CK21 is set to a high level, the signal RS21 is set to a high level, the signal S1A is at a low level, the signal S1B is at a low level, the signal S2A is at a low level, and voltage of the signal S2B is equivalent to the value of the voltage Vb.

At this time, the divided signal output circuit is set to a reset state. The transistor 102*b* and the transistor 102*c* are turned off and the transistor 102*d* and the transistor 102*e* are turned on; therefore, voltage of the node NC2 (also referred to as $V_{NC2}$) becomes equivalent to the value of the voltage Va and the transistor 102*g* is turned on. Further, the transistor 102*g* is turned on and the transistor 102*a* is turned off; therefore, voltage of the node NA2 (also referred to as $V_{NA2}$) becomes equivalent to the value of the voltage Vb. Since the transistor 102*f* is in an on state, voltage of the node NB2 (also referred to as $V_{NB2}$) becomes equivalent to the value of the voltage Vb and the transistor 102*h* is turned off. Further, the transistor 102*h*, the transistor 102*i*, the transistor 102*j*, the transistor 102*k*, the transistor 102*l*, and the transistor 102*m* are turned off, so that the signal OUT21 maintains the state in the previous period.

Next, at a time T22, the signal CK21 is set to a low level, the signal RS21 remains at a high level, the signal S1A remains at a low level, the signal S1B remains at a low level, the signal S2A remains at a low level, and the voltage of the signal S2B remains equivalent to the value of the voltage Vb.

At this time, the transistor 102*b* and the transistor 102*c* remain off, the transistor 102*d* is turned off, and the transistor 102*e* remains on; therefore, the voltage of the node NC2 remains equivalent to the value of the voltage Va and the transistor 102*g* remains on. Further, the transistor 102*a* remains off and the transistor 102*g* remains on; therefore, the voltage of the node NA2 remains equivalent to the value of the voltage Vb. Since the transistor 102*f* remains on, the voltage of the node NB2 remains equivalent to the value of the voltage Vb and the transistor 102*h* remains off. Further, the transistor 102*h*, the transistor 102*i*, the transistor 102*j*, the transistor 102*k*, the transistor 102*l*, and the transistor 102*m* remain off, so that the signal OUT21 maintains the state in the previous period.

Next, at a time T23, the signal CK21 is set to a high level, the signal RS21 is set to a low level, the signal S1A is set to a high level, the signal S1B remains at a low level, the signal S2A remains at a low level, and the voltage of the signal S2B remains equivalent to the value of the voltage Vb.

At this time, the transistor 102*b* and the transistor 102*c* remain off, the transistor 102*d* is turned on, and the transistor 102*e* is turned off; therefore, the voltage of the node NC2 remains equivalent to the value of the voltage Va and the transistor 102*g* remains on. Further, the transistor 102*a* remains off and the transistor 102*g* remains on; therefore, the voltage of the node NA2 remains equivalent to the value of the voltage Vb. Since the transistor 102*f* remains on, the voltage of the node NB2 remains equivalent to the value of the voltage Vb and the transistor 102*h* remains off. Further, the transistor 102*l* is turned on and the transistor 102*h*, the transistor 102*i*, the transistor 102*j*, the transistor 102*k*, and the transistor 102*m* remain off, so that the signal OUT21 is set to a low level.

Next, at a time T24, the signal CK21 is set to a low level, the signal RS21 remains at a low level, the signal S1A is set to a low level, the signal S1B is set to a high level, the signal S2A remains at a low level, and the voltage of the signal S2B remains equivalent to the value of the voltage Vb.

At this time, the transistor 102*b* and the transistor 102*e* remain off, the transistor 102*c* is turned on, and the transistor 102*d* is turned off; therefore, the voltage of the node NC2 becomes equivalent to the value of the voltage Vb and the transistor 102*g* is turned off. Further, the transistor 102*a* is turned on and the transistor 102*g* is turned off; therefore, the voltage of the node NA2 becomes equivalent to the value of the voltage Va. Since the transistor 102*f* is in an on state, the voltage of the node NB2 becomes equivalent to the value of the voltage Va, the transistor 102*h* is turned on, and the voltage of the node NA2 and the voltage of the node NB2 become equivalent to the value of the voltage Va; accordingly, the transistor 102*f* is turned off. Further, the transistor 102*l* is turned off, the transistor 102*h* and the transistor 102*j* are turned on, and the transistor 102*i*, the transistor 102*k*, and the transistor 102*m* remain off, so that the signal OUT21 remains at a low level.

Next, at a time T25, the signal CK21 is set to a high level, the signal RS21 remains at a low level, the signal S1A remains at a low level, the signal S1B is set to a low level, the signal S2A is set to a high level, and the voltage of the signal S2B becomes equivalent to the value of the voltage Va.

At this time, the transistor 102*a* is turned off and the transistor 102*f* remains off; therefore, the node NB2 enters a floating state. Since the transistor 102h remains on, the voltage of the other of the source and the drain of the transistor 102h is increased. Then, the voltage of the node NB2 is increased because of capacitive coupling due to parasitic capacitance generated between the gate of the transistor 102h and the other of the source and the drain of the transistor 102h. This is so-called bootstrap operation. The voltage of the node NB2 is increased to a value which is larger than the sum of the voltage Va and the threshold voltage of the transistor 102h (also referred to as $Vth_{102h}$), that is, $Va+Vth_{102h}+Vx$. At this time, the transistor 102h remains on. Further, the transistor 102i and the transistor 102k are turned on, the transistor 102j is turned off, the transistor 102h remains on, and the transistor 102l remains off; therefore, the signal OUT21 is set to a high level. Further, the transistor 102b and the transistor 102d are turned on, the transistor 102c is turned off, and the transistor 102e remains off; therefore, the voltage of the node NC2 becomes equivalent to the value of the voltage Va and the transistor 102g is turned on. Since the transistor 102g is in an on state and the transistor 102a is in an off state, the voltage of the node NB2 becomes equivalent to the value of the voltage Vb. Further, the transistor 102f is turned on and the transistor 102m is turned on, so that the voltage of the node NB2 becomes equivalent to the value of the voltage Vb and the transistor 102h is turned off.

Next, at a time T26, the signal CK21 is set to a low level, the signal RS21 remains at a low level, the signal S1A remains at a low level, the signal S1B remains at a low level, the signal S2A is set to a low level, and the voltage of the signal S2B becomes $Va+Vth_{102h}+Vx$.

At this time, the transistor 102b remains on, the transistor 102c and the transistor 102e remain off, and the transistor 102d is turned off; therefore, the voltage of the node NC2 remains equivalent to the value of the voltage Va and the transistor 102g remains on. Further, the transistor 102a remains off and the transistor 102g remains on; therefore, the voltage of the node NA2 remains equivalent to the value of the voltage Vb. Since the transistor 102f remains on, the voltage of the node NB2 remains equivalent to the value of the voltage Vb and the transistor 102h remains off. Further, the transistor 102i and the transistor 102m are turned off, the transistor 102h, the transistor 102j, and the transistor 102l remain off, and the transistor 102k remains on, so that the signal OUT21 remains at a high level.

Thus, the divided signal output circuit outputs the signal CLK3 as the signal OUT21. The signal CLK3 is a clock signal, whose cycle is twice longer than the cycle of the signal CLK1.

Further, an example of operation of the divided signal output circuit illustrated in FIG. 3B will be described with the use of the above-described description of the example of operation of the divided signal output circuit illustrated in FIG. 3A.

Figure 6:
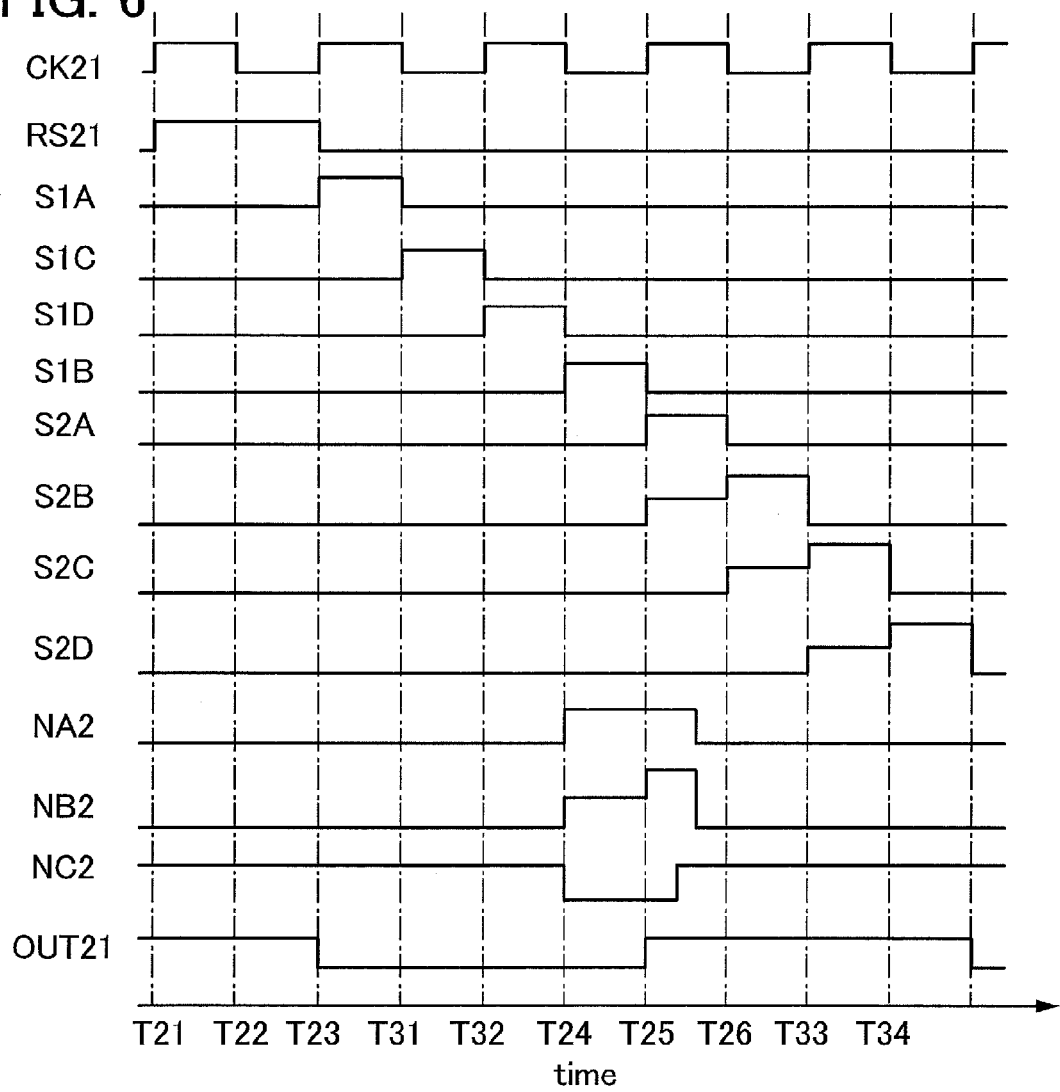
FIG. 6 is a timing chart showing an example of operation of a divided signal output circuit in a divider circuit in Embodiment 2.

An example of operation of the divided signal output circuit illustrated in FIG. 3B will be described with reference to FIG. 6. FIG. 6 is a timing chart showing an example of operation of the divided signal output circuit illustrated in FIG. 3B.

As shown in FIG. 6, in the divided signal output circuit illustrated in FIG. 3B, in addition to the operation of the divided signal output circuit illustrated in FIG. 3A, at a time T31 between the time T23 and the time T24, the signal CK21 is set to a low level, the signal RS21 remains at a low level, the signal S1A is set to a low level, the signal S1C is set to a high level, the signal S1D remains at a low level, the signal S1B remains at a low level, the signal S2A remains at a low level, the voltage of the signal S2B remains equivalent to the value of the voltage Vb, the voltage of the signal S2C remains equivalent to the value of the voltage Vb, and the signal S2D remains at a low level.

At this time, the transistor 102b, the transistor 102c, and the transistor 102e remain off and the transistor 102d is turned off; therefore, the voltage of the node NC2 remains equivalent to the value of the voltage Va and the transistor 102g remains on. Further, the transistor 102a remains off and the transistor 102g remains on; therefore, the voltage of the node NA2 remains equivalent to the value of the voltage Vb. Since the transistor 102f remains on, the voltage of the node NB2 remains equivalent to the value of the voltage Vb and the transistor 102h remains off. The transistor 102l is turned off, the transistor 102o is turned on, and the transistor 102h, the transistor 102i, the transistor 102j, the transistor 102k, the transistor 102m, the transistor 102n, the transistor 102p, and the transistor 102q remain off, so that the signal OUT21 remains at a low level.

Next, at a time T32, the signal CK21 is set to a high level, the signal RS21 remains at a low level, the signal S1A remains at a low level, the signal S1C is set to a low level, the signal S1D is set to a high level, the signal S1B remains at a low level, the signal S2A remains at a low level, the voltage of the signal S2B remains equivalent to the value of the voltage Vb, the voltage of the signal S2C remains equivalent to the value of the voltage Vb, and the voltage of the signal S2D remains equivalent to the value of the voltage Vb.

At this time, the transistor 102b, the transistor 102c, and the transistor 102e remain off, and the transistor 102d is turned on; therefore, the voltage of the node NC2 remains equivalent to the value of the voltage Va and the transistor 102g remains on. Further, the transistor 102a remains off and the transistor 102g remains on; therefore, the voltage of the node NA2 remains equivalent to the value of the voltage Vb. Since the transistor 102f remains on, the voltage of the node NB2 remains equivalent to the value of the voltage Vb and the transistor 102h remains off. Further, the transistor 102o is turned off, the transistor 102q is turned on, and the transistor 102h, the transistor 102i, the transistor 102j, the transistor 102k, the transistor 102l, the transistor 102m, the transistor 102n, and the transistor 102p remain off, so that the signal OUT21 remains at a low level.

Further, at the time T25, the signal CK21 is set to a high level, the signal RS21 remains at a low level, the signal S1A remains at a low level, the signal S1C remains at a low level, the signal S1D remains at a low level, the signal S1B is set to a low level, the signal S2A is set to a high level, the voltage of the signal S2B becomes equivalent to the value of the voltage Va, the voltage of the signal S2C remains equivalent to the value of the voltage Vb, and the voltage of the signal S2D remains equivalent to the value of the voltage Vb.

At this time, the transistor 102a is turned off and the transistor 102f remains off; therefore, the node NB2 enters a floating state. Since the transistor 102h remains on, the voltage of the other of the source and the drain of the transistor 102h is increased. Then, the voltage of the node NB2 is increased because of capacitive coupling due to parasitic capacitance generated between the gate of the transistor 102h and the other of the source and the drain of the transistor 102h. This is so-called bootstrap operation. The voltage of the node NB2 is increased to a value which is larger than the sum of the voltage Va and the threshold voltage of the transistor 102h (also referred to as $Vth_{102h}$), that is, $Va+Vth_{102h}+Vx$. At this time, the transistor 102h remains on. Further, the transistor 102i and the transistor 102k are turned on, the transistor 102j is turned off, the transistor 102h remains on, and the transistor 102l, the transistor 102n, the transistor 102o, and the transistor 102q remain off; therefore, the signal OUT21 is set to a high level. The transistor 102b and the transistor 102d are turned on, the transistor 102c is turned off, and the transistor 102e remains off; therefore, the voltage of the node NC2 becomes equivalent to the value of the voltage Va and the transistor 102g is turned on. Since the transistor 102g is turned on and the transistor 102a is turned off, the voltage of the node NB2 becomes equivalent to the value of the voltage Vb. Further, the transistor 102f is turned on and the transistor 102m is turned on, so that the voltage of the node NB2 becomes equivalent to the value of the voltage Vb and the transistor 102h is turned off.

Next, at the time T26, the signal CK21 is set to a low level, the signal RS21 remains at a low level, the signal S1A remains at a low level, the signal S1C remains at a low level, the signal S1D remains at a low level, the signal S1B remains at a low level, the signal S2A is set to a low level, the voltage of the signal S2B becomes Va+Vth$_{102h}$+Vx, the voltage of the signal S2C becomes equivalent to the value of the voltage Va, and the voltage of the signal S2D remains equivalent to the value of the voltage Vb.

At this time, the transistor 102b remains on, the transistor 102c and the transistor 102e remain off, and the transistor 102d is turned off; therefore, the voltage of the node NC2 remains equivalent to the value of the voltage Va and the transistor 102g remains on. Further, the transistor 102a remains off and the transistor 102g remains on; therefore, the voltage of the node NA2 remains equivalent to the value of the voltage Vb. Since the transistor 102f remains on, the voltage of the node NB2 remains equivalent to the value of the voltage Vb and the transistor 102h remains off. Further, the transistor 102i and the transistor 102m are turned off, the transistor 102n is turned on, the transistor 102k remains on, and the transistor 102h, the transistor 102j, the transistor 1021, the transistor 102o, and the transistor 102q remain off, so that the signal OUT21 remains at a high level.

Further, at a time T33 after the time T26, the signal CK21 is set to a high level, the signal RS21 remains at a low level, the signal S1A remains at a low level, the signal S1C remains at a low level, the signal S1D remains at a low level, the signal S1B remains at a low level, the signal S2A remains at a low level, the voltage of the signal S2B becomes equivalent to the value of the voltage Vb, the voltage of the signal S2C becomes Va+Vth$_{101h}$+Vx, and the voltage of the signal S2D becomes equivalent to the value of the voltage Va.

At this time, the transistor 102c remains off, the transistor 102b is turned off, the transistor 102d is turned on, and the transistor 102e remains off; therefore, the voltage of the node NC2 remains equivalent to the value of the voltage Va, and the transistor 102g remains on. Further, the transistor 102a remains off and the transistor 102g remains on; therefore, the voltage of the node NA2 remains equivalent to the value of the voltage Vb. Since the transistor 102f remains on, the voltage of the node NB2 remains equivalent to the value of the voltage Vb and the transistor 102h remains off. Further, the transistor 102n remains on, the transistor 102k is turned off, the transistor 102p is turned on, and the transistor 102h, the transistor 102i, the transistor 102j, the transistor 1021, the transistor 102m, the transistor 102o, and the transistor 102q remain off, so that the signal OUT21 remains at a high level.

Further, at a time T34, the signal CK21 is set to a low level, the signal RS21 remains at a low level, the signal S1A remains at a low level, the signal S1C remains at a low level, the signal S1D remains at a low level, the signal S1B remains at a low level, the signal S2A remains at a low level, the voltage of the signal S2B remains equivalent to the value of the voltage Vb, the voltage of the signal S2C becomes equivalent to the value of the voltage Vb, and the voltage of the signal S2D becomes Va+Vth$_{102h}$+Vx.

At this time, the transistor 102b, the transistor 102c, and the transistor 102e remain off and the transistor 102d is turned off; therefore, the voltage of the node NC2 remains equivalent to the value of the voltage Va and the transistor 102g remains on. The transistor 102a remains off and the transistor 102g remains on; therefore, the voltage of the node NA2 remains equivalent to the value of the voltage Vb. Since the transistor 102f remains on, the voltage of the node NB2 remains equivalent to the value of the voltage Vb and the transistor 102h remains off. Further, the transistor 102n is turned off, the transistor 102p remains on, and the transistor 102h, the transistor 102i, the transistor 102j, the transistor 102k, the transistor 102l, the transistor 102m, the transistor 102o, and the transistor 102q remain off, so that the signal OUT21 remains at a high level.

Thus, the divided signal output circuit outputs the signal CLK3 as the signal OUT21. The signal CLK3 is a clock signal whose cycle is four times longer than the cycle of the signal CLK1.

As described above, an example of the divider circuit of this embodiment includes a shift register and a divided signal output circuit. The shift register has a function of outputting 2X pulse signals in accordance with a first clock signal and a second clock signal. The divided signal output circuit sets voltage of a signal to be a third clock signal in such a manner that X first transistors and X second transistors are sequentially turned on in accordance with the 2X pulse signals, and the divided signal output circuit outputs the third clock signal with a cycle X times longer than a cycle of the first clock signal. In the shift register in the divider circuit of this embodiment, it takes shorter time to set the voltage of the pulse signal to a desired value. This is because the voltage of the pulse signal to be an output signal is set in accordance with the voltage of the clock signal. Accordingly, with the use of the shift register, operation speed of the divider circuit can be improved, and a malfunction in dividing operation can be prevented.

In an example of the divider circuit of this embodiment, a voltage signal having a value higher than power supply voltage is employed for setting voltage of a signal to be a third clock signal to a second voltage. With such a structure, the voltage of the third clock signal at a high level can be set higher than or equal to the power supply voltage.

Embodiment 3

In this embodiment, a divider circuit in which a divider circuit including a shift register and a divider circuit having another structure are used in combination will be described.

Figure 7:
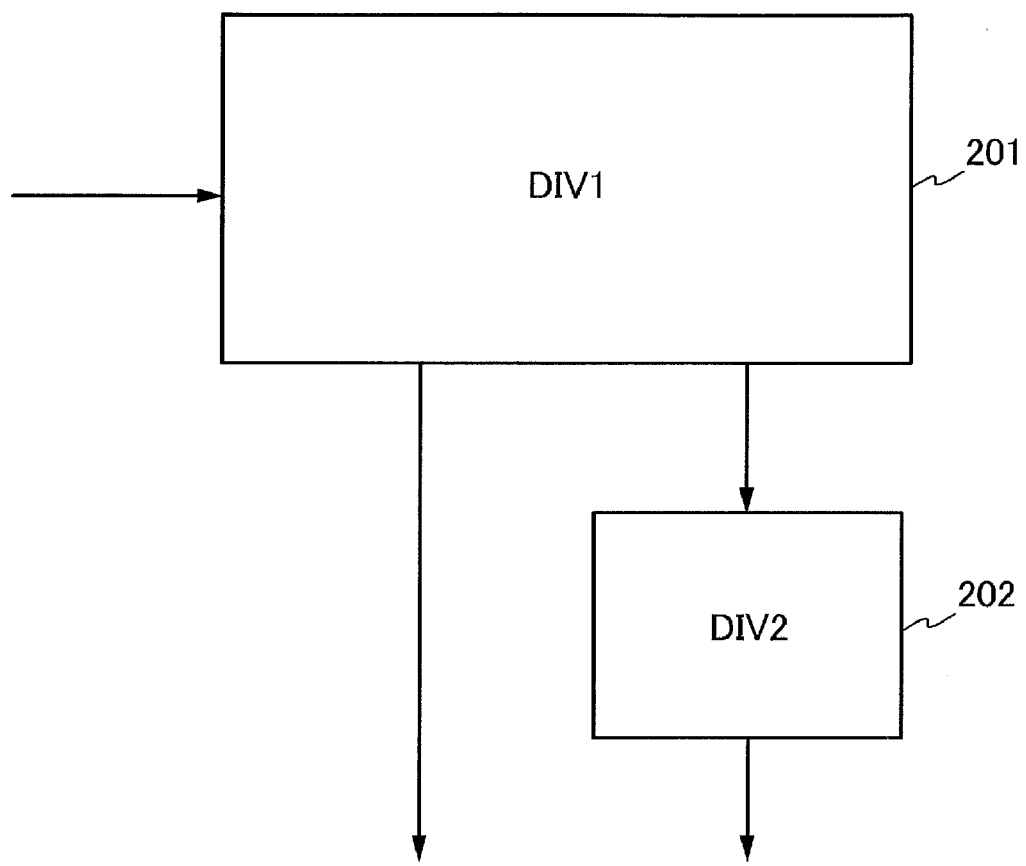
FIG. 7 is a block diagram illustrating an example of a structure of a divider circuit in Embodiment 3.

An example of a structure of the divider circuit of this embodiment will be described with reference to FIG. 7. FIG. 7 is a block diagram illustrating an example of a structure of the divider circuit of this embodiment.

The divider circuit illustrated in FIG. 7 includes a unit divider circuit 201 (also referred to as DIV1) and a unit divider circuit 202 (also referred to as DIV2).

A start signal SP31 (also referred to as a signal SP31) and a clock signal CK31 (also referred to as a signal CK31) are input to the unit divider circuit 201. The unit divider circuit 201 outputs a clock signal CK32 (also referred to as a signal CK32) with a cycle X times longer than a cycle of the signal CK31. Any of the divider circuits described in the above embodiments can be applied to the unit divider circuit 201. In this case, the signal SP31 corresponds to the signal SP and the signal CK32 corresponds to the signal OUT21.

The signal SP31 and the signal CK32 are input to the unit divider circuit 202. The unit divider circuit 202 outputs a clock signal CK33 (also referred to as a signal CK33) with a cycle K times (K is a natural number greater than or equal to 2) longer than a cycle of the signal CK32. A flip-flop can be used for the unit divider circuit 202, for example. Further, the unit divider circuit 202 may include a plurality of flip-flops. When a flip-flop is formed using transistors of the same conductivity type, the divider circuit 202 can be formed in the same process as the unit divider circuit 201. With such a structure, clock signals which have cycles different from each other and K times longer than the cycle of the signal CK32 can be generated.

As described with reference to FIG. 7, an example of the divider circuit of this embodiment is provided with a first unit divider circuit and a second unit divider circuit. The first unit divider circuit is the divider circuit described in any of the above embodiments, and a cycle of a clock signal which is an output signal of the second unit divider circuit is longer than a cycle of a clock signal which is an output signal of the first unit divider circuit. The second unit divider circuit can have a circuit configuration simpler than that of the first unit divider circuit. Further, the speed of dividing operation is generally faster as a cycle of the clock signal at the time after frequency division is shorter. Therefore, when the first unit divider circuit and the second unit divider circuit are used in combination, clock signals with cycles different from each other can be generated while increase in an area of a circuit is suppressed, and a malfunction is suppressed.

Embodiment 4

In this embodiment, a transistor including an oxide semiconductor layer, which can be used in any of the divider circuits of the above embodiments, will be described.

The transistor including an oxide semiconductor layer, which can be used in any of the divider circuits of the above embodiments, is a transistor including a semiconductor layer which is highly purified to be intrinsic (also referred to as I-type) or substantially intrinsic.

Examples of an oxide semiconductor used in the oxide semiconductor layer are a four-component metal oxide, a three-component metal oxide, and a two-component metal oxide. As the four-component metal oxide, an In—Sn—Ga—Zn—O-based metal oxide or the like can be used, for example. As the three-component metal oxide, an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, or the like can be used, for example. As the two-component metal oxide, an In—Zn—O-based metal oxide, a Sn—Zn—O-based metal oxide, an Al—Zn—O-based metal oxide, a Zn—Mg—O-based metal oxide, a Sn—Mg—O-based metal oxide, an In—Mg—O-based metal oxide, an In—Sn—O-based metal oxide, or the like can be used, for example. In addition, an In—O-based metal oxide, a Sn—O-based metal oxide, a Zn—O-based metal oxide, or the like can also be used as the oxide semiconductor. Moreover, the metal oxide that can be used as the oxide semiconductor may contain $SiO_2$.

As the oxide semiconductor, a material represented by $InMO_3(ZnO)_m$ (m is larger than 0) can be used. Here, M represents one or more metal elements selected from Ga, Al, Mn, and Co. For example, Ga, Ga and Al, Ga and Mn, Ga and Co, and the like can be given as M.

The band gap of the oxide semiconductor layer is greater than or equal to 2 eV, preferably greater than or equal to 2.5 eV, more preferably greater than or equal to 3 eV, which reduces the number of carriers generated by thermal excitation to a negligible level. In addition, the amount of impurity such as hydrogen which might serve as a donor is reduced to a certain amount or less so that the carrier concentration is lower than $1\times10^{14}/cm^3$, preferably lower than or equal to $1\times10^{12}/cm^3$. That is, the carrier concentration of the oxide semiconductor layer is reduced to zero or substantially zero.

In the aforementioned oxide semiconductor layer, the avalanche breakdown does not easily occur and the breakdown voltage is high. For example, the band gap of silicon is as narrow as 1.12 eV; thus, electrons are easily generated like an avalanche owing to the avalanche breakdown, and the number of electrons which are accelerated to high speed so as to go over an energy barrier to a gate insulating layer is increased. In contrast, since the oxide semiconductor used for the aforementioned oxide semiconductor layer has a band gap of as wide as 2 eV or more, the avalanche breakdown does not easily occur and resistance to hot-carrier degradation is higher than that of silicon, and the breakdown voltage is thus high.

Hot-carrier degradation means, for example, degradation of transistor characteristics due to fixed charges caused by the fact that accelerated electrons are injected into a gate insulating layer in the vicinity of a drain in a channel; or degradation of transistor characteristics due to a trap level or the like formed by highly-accelerated electrons at the interface between an oxide semiconductor layer and a gate insulating layer. Examples of degradation of transistor characteristics due to hot carriers are variations in threshold voltage and gate leakage. The hot-carrier degradation is caused by channel-hot-electron injection (also referred to as CHE injection) or drain-avalanche-hot-carrier injection (also referred to as DAHC injection).

Note that the band gap of silicon carbide, which is one of materials having high breakdown voltage, is substantially equal to that of an oxide semiconductor used for the oxide semiconductor layer, but electrons are less likely to be accelerated in an oxide semiconductor because the mobility of the oxide semiconductor is lower than that of silicon carbide by approximately two orders of magnitude. Further, a barrier between a gate insulating layer and an oxide semiconductor is larger than a barrier between a gate insulating layer and silicon carbide, gallium nitride, or silicon; therefore, the number of electrons injected into the gate insulating layer is extremely small, whereby hot-carrier degradation is less likely to be caused and breakdown voltage is higher as compared to the case of silicon carbide, gallium nitride, or silicon. The oxide semiconductor has high breakdown voltage even in an amorphous state.

Furthermore, the transistor including the oxide semiconductor layer can have an off-state current per micrometer of channel width of 10 aA ($1\times10^{-17}$ A) or smaller, 1 aA ($1\times10^{-18}$ A) or smaller, 10 zA ($1\times10^{-20}$ A) or smaller, and further 1 zA ($1\times10^{-21}$ A) or smaller.

In the transistor including the above oxide semiconductor layer, degradation due to light (e.g., variations in the threshold voltage) is little.

Examples of structures of the transistors including an oxide semiconductor layer, which is applicable to any of the divider circuits described in the above embodiments, will be described with reference to FIGS. 8A to 8D. FIGS. 8A to 8D are cross-sectional schematic views each illustrating an example of the structure of the transistor.

Figure 8A:
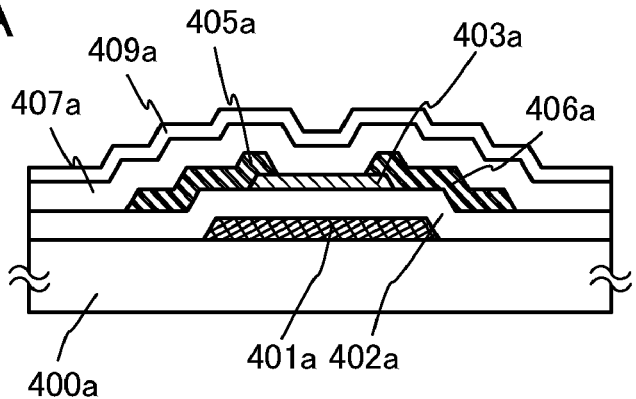
FIGS. 8A to 8D are cross-sectional schematic views each illustrating an example of a structure of a transistor in Embodiment 4.

The transistor illustrated in FIG. 8A is one of bottom-gate transistors, which is also referred to as an inverted staggered transistor.

The transistor illustrated in FIG. 8A includes a conductive layer 401a serving as a gate electrode, an insulating layer 402a serving as a gate insulating layer, an oxide semiconductor layer 403a serving as a channel formation layer, and a conductive layer 405a and a conductive layer 406a serving as a source or drain electrode.

The conductive layer 401a is formed over a substrate 400a, the insulating layer 402a is formed over the conductive layer 401a, the oxide semiconductor layer 403a is formed over the conductive layer 401a with the insulating layer 402a interposed therebetween, and the conductive layer 405a and the conductive layer 406a are each formed over part of the oxide semiconductor layer 403a.

Further, in the transistor illustrated in FIG. 8A, an oxide insulating layer 407a is in contact with part of a top surface of the oxide semiconductor layer 403a (part of the oxide semiconductor layer 403a over which neither the conductive layer 405a nor the conductive layer 406a is provided). In addition, a protective insulating layer 409a is provided over the oxide insulating layer 407a.

Figure 8B:
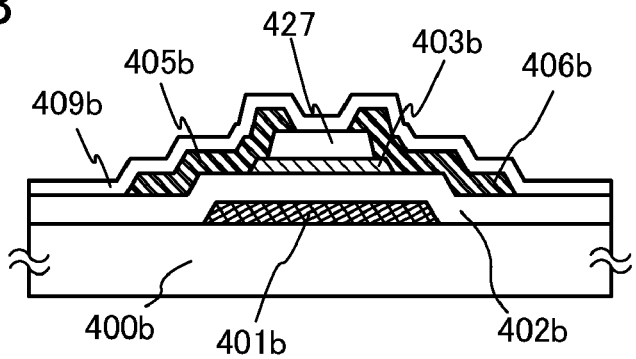

The transistor illustrated in FIG. 8B is a channel protective (also referred to as a channel stop) transistor which is one of the bottom-gate transistors, and is also referred to as an inverted staggered transistor.

The transistor illustrated in FIG. 8B includes a conductive layer 401b serving as a gate electrode, an insulating layer 402b serving as a gate insulating layer, an oxide semiconductor layer 403b serving as a channel formation layer, an insulating layer 427 serving as a channel protective layer, and a conductive layer 405b and a conductive layer 406b serving as a source or drain electrode.

The conductive layer 401b is formed over a substrate 400b, the insulating layer 402b is formed over the conductive layer 401b, the oxide semiconductor layer 403b is formed over the conductive layer 401b with the insulating layer 402b interposed therebetween, the insulating layer 427 is formed over the conductive layer 401b with the insulating layer 402b and the oxide semiconductor layer 403b interposed therebetween, and the conductive layer 405b and the conductive layer 406b are formed over part of the oxide semiconductor layer 403b with the insulating layer 427 interposed therebetween. Further, a structure can be employed in which the entire oxide semiconductor layer 403b overlaps with the conductive layer 401b. When the entire oxide semiconductor layer 403b overlaps with the conductive layer 401b, light can be prevented from entering the oxide semiconductor layer 403b. The structure which is employed is not limited thereto, and a structure can be employed in which the conductive layer 401b overlaps with part of the oxide semiconductor layer 403b.

Further, a protective insulating layer 409b is in contact with a top part of the transistor illustrated in FIG. 8B.

Figure 8C:
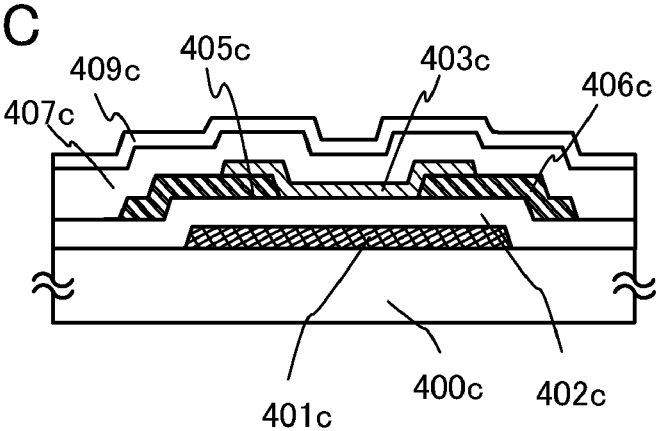

The transistor illustrated in FIG. 8C is one of the bottom-gate transistors.

The transistor illustrated in FIG. 8C includes a conductive layer 401c serving as a gate electrode, an insulating layer 402c serving as a gate insulating layer, an oxide semiconductor layer 403c serving as a channel formation layer, and a conductive layer 405c and a conductive layer 406c serving as a source or drain electrode.

The conductive layer 401c is formed over a substrate 400c, the insulating layer 402c is formed over the conductive layer 401c, the conductive layer 405c and the conductive layer 406c are formed over part of the insulating layer 402c, and the oxide semiconductor layer 403c is formed over the conductive layer 401c with the insulating layer 402c, the conductive layer 405c, and the conductive layer 406c interposed therebetween. Further, a structure can be employed in which the entire oxide semiconductor layer 403c overlaps with the conductive layer 401c. When the entire oxide semiconductor layer 403c overlaps with the conductive layer 401c, light can be prevented from entering the oxide semiconductor layer 403c. The structure which is employed is not limited thereto, and a structure can be employed in which the conductive layer 401c overlaps with part of the oxide semiconductor layer 403c.

Further, in the transistor illustrated in FIG. 8C, an oxide insulating layer 407c is in contact with an upper surface and a side surface of the oxide semiconductor layer 403c. In addition, a protective insulating layer 409c is provided over the oxide insulating layer 407c.

Figure 8D:
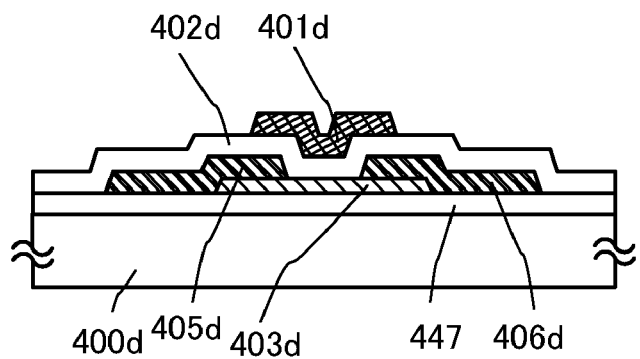

The transistor illustrated in FIG. 8D is one of top-gate transistors.

The transistor illustrated in FIG. 8D includes a conductive layer 401d serving as a gate electrode, an insulating layer 402d serving as a gate insulating layer, an oxide semiconductor layer 403d serving as a channel formation layer, and a conductive layer 405d and a conductive layer 406d serving as a source or drain electrode.

The oxide semiconductor layer 403d is formed over a substrate 400d with an insulating layer 447 interposed therebetween, the conductive layer 405d and the conductive layer 406d are each formed over part of the oxide semiconductor layer 403d, the insulating layer 402d is formed over the oxide semiconductor layer 403d, the conductive layer 405d, and the conductive layer 406d, and the conductive layer 401d is formed over the oxide semiconductor layer 403d with the insulating layer 402d interposed therebetween.

As the substrates 400a to 400d, a glass substrate of barium borosilicate glass, aluminoborosilicate glass, or the like can be used, for example.

Alternatively, a substrate of an insulator, such as a ceramic substrate, a quartz substrate, or a sapphire substrate, can be used as the substrates 400a to 400d. Further alternatively, crystallized glass can be used for the substrates 400a to 400d. Still further alternatively, a plastic substrate or a semiconductor substrate of silicon or the like can be used as the substrates 400a to 400d.

The insulating layer 447 has a function of a base layer which prevents diffusion of an impurity element from the substrate 400d. As the insulating layer 447, a silicon nitride layer, a silicon oxide layer, a silicon nitride oxide layer, a silicon oxynitride layer, an aluminum oxide layer, or an aluminum oxynitride layer can be used, for example. The insulating layer 447 can also be formed by stacking layers of materials which can be used for the insulating layer 447. Alternatively, as the insulating layer 447, a stack of a layer including a material having a light-blocking property and a layer including a material applicable to the insulating layer 447 can be used. When the insulating layer 447 includes a layer of a material having a light-blocking property, light can be prevented from entering the oxide semiconductor layer 403d.

Note that in each of the transistors illustrated in FIGS. 8A to 8C, an insulating layer may be formed between the substrate and the conductive layer serving as a gate electrode, as in the transistor illustrated in FIG. 8D.

As the conductive layers 401a to 401d, it is possible to use, for example, a layer of a metal material such as molybdenum, titanium, chromium, tantalum, tungsten, aluminum, copper, neodymium, or scandium or an alloy material containing any of these materials as a main component. The conductive layers 401a to 401d can also be formed by stacking layers of materials which can be used for the conductive layers 401a to 401d.

As the insulating layers 402a to 402d, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer can be used, for example. The insulating layers 402a to 402d can also be formed by stacking layers of materials which can be used for the insulating layers 402a to 402d. The layers of materials which can be used for the insulating layers 402a to 402d can be formed by a plasma CVD method, a sputtering method, or the like. For example, the insulating layers 402a to 402d can be formed in such a manner that a silicon nitride layer is formed by a plasma CVD method and a silicon oxide layer is formed over the silicon nitride layer by a plasma CVD method.

As an oxide semiconductor which can be used for the oxide semiconductor layers 403a to 403d, a four-component metal oxide, a three-component metal oxide, and a two-component metal oxide can be given, for example. As the four-component metal oxide, an In—Sn—Ga—Zn—O-based metal oxide or the like can be given, for example. As the three-component metal oxide, an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, or the like can be given, for example. As the two-component metal oxide, an In—Zn—O-based metal oxide, a Sn—Zn—O-based metal oxide, an Al—Zn—O-based metal oxide, a Zn—Mg—O-based metal oxide, a Sn—Mg—O-based metal oxide, an In—Mg—O-based metal oxide, an In—Sn—O-based metal oxide, or the like can be given. Further, as the oxide semiconductor, an In—O-based metal oxide, a Sn—O-based metal oxide, a Zn—O-based metal oxide, or the like can be used. The metal oxide that can be used as the oxide semiconductor may contain $SiO_2$. Here, for example, the In—Ga—Zn—O-based metal oxide means an oxide containing at least In, Ga, and Zn, and the composition ratio of the elements is not particularly limited. The In—Ga—Zn—O-based metal oxide may contain an element other than In, Ga, and Zn.

In the case where an In—Zn—O-based material is used as an oxide semiconductor, a target to be used has a composition ratio of In:Zn=50:1 to 1:2 in an atomic ratio ($In_2O_3$:ZnO=25:1 to 1:4 in a molar ratio), preferably, In:Zn=20:1 to 1:1 in an atomic ratio ($In_2O_3$:ZnO=10:1 to 1:2 in a molar ratio), further preferably, In:Zn=15:1 to 1.5:1 in an atomic ratio ($In_2O_3$:ZnO=15:2 to 3:4 in a molar ratio). For example, in a target used for formation of an In—Zn—O-based oxide semiconductor which has an atomic ratio of In:Zn:O=W:Y:Z, the relation of Z>1.5 W+Y is satisfied.

Further, as an oxide semiconductor which can be used for the oxide semiconductor layers 403a to 403d, a metal oxide represented by a chemical formula $InMO_3(ZnO)_m$ (m is larger than 0) can be given. Here, M represents one or more metal elements selected from Ga, Al, Mn, and Co. For example, Ga, Ga and Al, Ga and Mn, Ga and Co, and the like can be given as M.

As the conductive layers 405a to 405d and the conductive layers 406a to 406d, a layer of a metal material such as aluminum, chromium, copper, tantalum, titanium, molybdenum, or tungsten or an alloy material containing any of the metal materials as a main component can be used, for example. The conductive layers 405a to 405d and the conductive layers 406a to 406d can also be formed by stacking layers of materials which can be used for the conductive layers 405a to 405d and the conductive layers 406a to 406d.

For example, the conductive layers 405a to 405d and the conductive layers 406a to 406d can be formed by stacking a metal layer of aluminum or copper and a high-melting-point metal layer of titanium, molybdenum, tungsten, or the like. The conductive layers 405a to 405d and the conductive layers 406a to 406d may have a structure in which a metal layer of aluminum or copper is provided between a plurality of high-melting-point metal layers. Further, when the conductive layers 405a to 405d and the conductive layers 406a to 406d are formed using an aluminum layer to which an element that prevents generation of hillocks or whiskers (e.g., Si, Nd, or Sc) is added, heat resistance can be increased.

Alternatively, the conductive layers 405a to 405d and the conductive layers 406a to 406d can be formed using a layer containing a conductive metal oxide. As the conductive metal oxide, indium oxide ($In_2O_3$), tin oxide ($SnO_2$), zinc oxide (ZnO), an alloy of indium oxide and tin oxide ($In_2O_3$—$SnO_2$, abbreviated to ITO), an alloy of indium oxide and zinc oxide ($In_2O_3$—ZnO), or any of these metal oxide materials containing silicon oxide can be used, for example.

In addition, another wiring may be formed using a material used to form the conductive layers 405a to 405d and the conductive layers 406a to 406d.

As the insulating layer 427, a layer which can be applied to the insulating layer 447 can be used, for example. The insulating layer 427 can also be formed by stacking layers of materials which can be applied to the insulating layer 427.

As the oxide insulating layer 407a and the oxide insulating layer 407c, an oxide insulating layer can be used and, for example, a silicon oxide layer or the like can be used. The oxide insulating layer 407a and the oxide insulating layer 407c can also be formed by stacking layers of materials which can be applied to the oxide insulating layer 407a and the oxide insulating layer 407c.

As the protective insulating layers 409a to 409c, an inorganic insulating layer such as a silicon nitride layer, an aluminum nitride layer, a silicon nitride oxide layer, or an aluminum nitride oxide layer can be used, for example. The protective insulating layers 409a to 409c can also be formed by stacking layers of materials which can be applied to the protective insulating layers 409a to 409c.

In order to reduce surface unevenness due to the transistor of this embodiment, a planarization insulating layer can be formed over the transistor (over the transistor with the oxide insulating layer or the protective insulating layer interposed therebetween in the case where the transistor includes an oxide insulating layer or a protective insulating layer). As the planarization insulating layer, a layer of an organic material such as polyimide, acrylic, or benzocyclobutene can be used. Alternatively, a layer of a low-dielectric constant material (a low-k material) can be used as the planarization insulating layer. The planarization insulating layer can also be formed by stacking layers of materials which can be applied to the planarization insulating layer.

Next, as an example of a method for manufacturing the transistor including an oxide semiconductor layer, which can be applied to any of the divider circuits of the above embodiments, an example of a method for manufacturing the transistor illustrated in FIG. 8A will be described with reference to FIGS. 9A to 9C and FIGS. 10A and 10B. FIGS. 9A to 9C and FIGS. 10A and 10B are cross-sectional schematic views illustrating an example of the method for manufacturing the transistor illustrated in FIG. 8A.

First, the substrate 400a is prepared, and a first conductive film is formed over the substrate 400a.

A glass substrate is used as an example of the substrate 400a.

As the first conductive film, a film of a metal material such as molybdenum, titanium, chromium, tantalum, tungsten, aluminum, copper, neodymium, or scandium, or an alloy material which contains any of the metal materials as a main component can be used. The first conductive film can also be formed by stacking layers of materials which can be applied to the first conductive film.

Next, a first photolithography process is carried out: a first resist mask is formed over the first conductive film, the first conductive film is selectively etched with the use of the first resist mask to form the conductive layer 401a, and the first resist mask is removed.

In this embodiment, the resist mask may be formed by an inkjet method. Formation of the resist mask by an inkjet method needs no photomask; thus, manufacturing cost can be reduced.

In order to reduce the number of photomasks and steps in the photolithography process, the etching step may be performed using a resist mask formed with a multi-tone mask. A multi-tone mask is a light-exposure mask through which light is transmitted to have a plurality of intensities. A resist mask formed using a multi-tone mask has a plurality of thicknesses and further can be changed in shape by being etched, and thus can be used in a plurality of etching steps to provide different patterns. Therefore, a resist mask corresponding to at least two kinds or more of different patterns can be formed by one multi-tone mask. Thus, the number of light-exposure masks can be reduced and the number of corresponding photolithography processes can also be reduced, whereby a manufacturing process can be simplified.

Next, the insulating layer 402a is formed over the conductive layer 401a.

For example, the insulating layer 402a can be formed by a high-density plasma CVD method. For example, a high-density plasma CVD method using microwaves (e.g., microwaves with a frequency of 2.45 GHz) is preferable because an insulating layer can be dense and have high breakdown voltage and high quality. When the oxide semiconductor layer is in contact with the high-quality insulating layer formed by a high-density plasma CVD method, the interface state can be reduced and good interface characteristics can be obtained.

The insulating layer 402a can also be formed by another method such as a sputtering method or a plasma CVD method. Further, heat treatment may be performed after the formation of the insulating layer 402a. The heat treatment can improve the quality of the insulating layer 402a and the interface characteristics between the insulating layer 402a and the oxide semiconductor.

Next, an oxide semiconductor film 530 having a thickness of greater than or equal to 2 nm and less than or equal to 200 nm, preferably greater than or equal to 5 nm and less than or equal to 30 nm is formed over the insulating layer 402a. For example, the oxide semiconductor film 530 can be formed by a sputtering method.

Note that before the formation of the oxide semiconductor film 530, powdery substances (also referred to as particles or dust) attached on a surface of the insulating layer 402a are preferably removed by reverse sputtering in which an argon gas is introduced and plasma is generated. The reverse sputtering refers to a method in which, without application of voltage to a target side, an RF power source is used for application of voltage to a substrate side in an argon atmosphere, so that plasma is generated to modify a surface of the substrate. Note that instead of an argon atmosphere, a nitrogen atmosphere, a helium atmosphere, an oxygen atmosphere, or the like may be used.

For example, the oxide semiconductor film 530 can be formed using an oxide semiconductor material which can be used as a material of the oxide semiconductor layer 403a. In this embodiment, as an example, the oxide semiconductor film 530 is formed by a sputtering method with the use of an In—Ga—Zn—O-based oxide target. A cross-sectional schematic view at this stage corresponds to FIG. 9A. Further, the oxide semiconductor film 530 can be formed by a sputtering method in a rare gas (typically, argon) atmosphere, an oxygen atmosphere, or a mixed atmosphere of a rare gas and oxygen.

As a target for forming the oxide semiconductor film 530 by a sputtering method, for example, an oxide target having a composition ratio of $In_2O_3:Ga_2O_3:ZnO=1:1:1$ [molar ratio] can be used. Without limitation to the above target, an oxide target having a composition ratio of $In_2O_3:Ga_2O_3:ZnO=1:1:2$ [molar ratio] may be used, for example. The proportion of the volume of a portion except for an area occupied by a space and the like with respect to the total volume of the oxide target (also referred to as the filling rate) is higher than or equal to 90% and lower than or equal to 100%, and preferably higher than or equal to 95% and lower than or equal to 99.9%. With the use of a metal oxide target with high filling rate, the formed oxide semiconductor film has high density.

Note that as a sputtering gas used for forming the oxide semiconductor film 530, for example, a high-purity gas from which an impurity such as hydrogen, water, hydroxyl groups, or hydride is removed is preferably used.

Before the formation of the oxide semiconductor film 530, it is preferable that the substrate 400a over which the conductive layer 401a is formed or the substrate 400a over which the conductive layer 401a and the insulating layer 402a are formed be heated in a preheating chamber of the sputtering apparatus, so that an impurity such as hydrogen or moisture adsorbed on the substrate 400a is eliminated and removed. The heating can prevent hydrogen, hydroxyl groups, and moisture from entering the insulating layer 402a and the oxide semiconductor film 530. Note that a cryopump is preferably used as an exhaustion unit provided in the preheating chamber, for example. The heating treatment in the preheating chamber may be omitted. The heating may be similarly performed, before the formation of the oxide insulating layer 407a, on the substrate 400a over which layers up to and including the conductive layer 405a and the conductive layer 406a have been formed.

When the oxide semiconductor film 530 is formed by a sputtering method, the substrate 400a is held inside a film formation chamber which is kept in a reduced pressure state, and the substrate temperature is set to higher than or equal to 100° C. and lower than or equal to 600° C., preferably higher than or equal to 200° C. and lower than or equal to 400° C. By heating the substrate 400a, the concentration of an impurity contained in the oxide semiconductor film 530 can be reduced. Further, heating of the substrate 400a can reduce damage on the oxide semiconductor film 530 due to sputtering. Then, a sputtering gas from which hydrogen and moisture are removed is introduced while remaining moisture in the film formation chamber is removed, and the above-described target is used; thus, the oxide semiconductor film 530 is formed over the insulating layer 402a.

Note that in this embodiment, for example, an entrapment vacuum pump can be used as a means for removing moisture remaining in the film formation chamber in which sputtering is performed. As the entrapment vacuum pump, a cryopump, an ion pump, or a titanium sublimation pump can be used, for example. When a cryopump is used as an example, a compound including either or both of a hydrogen atom and a carbon atom, or the like can be evacuated, and thus the concentration of an impurity included in a film formed in the film formation chamber can be reduced. Further, in this embodiment, a turbo pump provided with a cold trap may be used as a means for removing moisture remaining in the film formation chamber in which sputtering is performed.

As one example of the deposition condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that when a pulsed direct-current power source is used, powdery substances generated at the time of film formation can be reduced and the film thickness can be made uniform.

Next, a second photolithography process is carried out: a second resist mask is formed over the oxide semiconductor film 530, the oxide semiconductor film 530 is selectively etched with the use of the second resist mask to process the oxide semiconductor film 530 into an island-shaped oxide semiconductor layer, and the second resist mask is removed.

In the case of forming a contact hole in the insulating layer 402a, the contact hole can be formed at the time of processing the oxide semiconductor film 530 into the island-shaped oxide semiconductor layer.

For example, dry etching, wet etching, or both dry etching and wet etching can be employed for etching the oxide semiconductor film 530. As an etchant used for wet etching, for example, a mixed solution of phosphoric acid, acetic acid, and nitric acid, or the like can be used. Alternatively, ITO07N (produced by KANTO CHEMICAL CO., INC.) may be used.

Next, the oxide semiconductor layer is subjected to first heat treatment. With the first heat treatment, dehydration or dehydrogenation of the oxide semiconductor layer can be conducted. The temperature of the first heat treatment is higher than or equal to 400° C. and lower than or equal to 750° C., preferably higher than or equal to 400° C. and lower than the strain point of the substrate. Here, the substrate is put in an electric furnace that is a kind of heat treatment apparatus and heat treatment is performed on the oxide semiconductor layer in a nitrogen atmosphere at 450° C. for one hour, and then the oxide semiconductor layer is not exposed to the air so that entry of water and hydrogen into the oxide semiconductor layer is prevented. In this manner, the oxide semiconductor layer 403a is obtained (see FIG. 9B).

The heat treatment apparatus is not limited to the electric furnace and may be the one provided with a device for heating a process object using heat conduction or heat radiation from a heating element such as a resistance heating element. For example, an RTA (rapid thermal annealing) apparatus such as a GRTA (gas rapid thermal annealing) apparatus or an LRTA (lamp rapid thermal annealing) apparatus can be used. An LRTA apparatus is an apparatus for heating a process object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the high-temperature gas, an inert gas which does not react with a process object by heat treatment, such as nitrogen or a rare gas like argon, can be used.

For example, as the first heat treatment, GRTA may be performed in the following manner. The substrate is moved into an inert gas heated to 650° C. to 700° C., heated for several minutes, and taken out of the heated inert gas.

Note that in the first heat treatment, it is preferable that water, hydrogen, or the like be not contained in nitrogen or a rare gas such as helium, neon, or argon. It is also preferable that nitrogen or a rare gas such as helium, neon, or argon introduced into the heat treatment apparatus have a purity of 6N (99.9999%) or more, preferably, 7N (99.99999%) or more (that is, the impurity concentration is set to be lower than or equal to 1 ppm, preferably, lower than or equal to 0.1 ppm).

After the oxide semiconductor layer is heated in the first heat treatment, a high-purity oxygen gas, a high-purity $N_2O$ gas, or ultra-dry air (having a dew point of −40° C. or lower, preferably −60° C. or lower) may be introduced into the same furnace that has been used in the first heat treatment. It is preferable that the oxygen gas or the $N_2O$ gas do not contain water, hydrogen, and the like. The purity of the oxygen gas or the $N_2O$ gas which is introduced into the heat treatment apparatus is preferably 6N or more, more preferably 7N or more (i.e., the impurity concentration of the oxygen gas or the $N_2O$ gas is preferably lower than or equal to 1 ppm, more preferably lower than or equal to 0.1 ppm). By the effect of the oxygen gas or the $N_2O$ gas, oxygen that has been reduced through the step of eliminating an impurity by the dehydration or dehydrogenation treatment is supplied; thus, the oxide semiconductor layer 403a is highly purified.

The first heat treatment may also be performed on the oxide semiconductor film 530 before being processed into the island-shaped oxide semiconductor layer. In such a case, the substrate is taken out of the heating apparatus after the first heat treatment and then the oxide semiconductor film 530 is processed into the island-shaped oxide semiconductor layer.

Other than the above-described timings, the first heat treatment may be performed, as long as it is performed after the formation of the oxide semiconductor layer, after the conductive layer 405a and the conductive layer 406a are formed over the oxide semiconductor layer 403a or after the oxide insulating layer 407a is formed over the conductive layer 405a and the conductive layer 406a In the case of forming a contact hole in the insulating layer 402a, the contact hole may be formed before the first heat treatment is performed.

The oxide semiconductor layer may be formed using an oxide semiconductor film which is formed through two deposition steps and two heat treatments so as to be a thick film including a crystalline region (a single crystal region), that is, a crystalline region having the c-axes aligned in a direction perpendicular to a surface of the film, regardless of the material of a base component such as an oxide, a nitride, or a metal. For example, a first oxide semiconductor film with a thickness of greater than or equal to 3 nm and less than or equal to 15 nm is formed and subjected to first heat treatment at a temperature higher than or equal to 450° C. and lower than or equal to 850° C., preferably higher than or equal to 550° C. and lower than or equal to 750° C. under an atmosphere of nitrogen, oxygen, a rare gas, or dry air, so that the first oxide semiconductor film which includes a crystalline region (including a plate-like crystal) in a region including a surface is formed. Then, a second oxide semiconductor film which is thicker than the first oxide semiconductor film is formed, and second heat treatment is performed at a temperature higher than or equal to 450° C. and lower than or equal to 850° C., preferably higher than or equal to 600° C. and lower than or equal to 700° C., so that crystal growth proceeds upward from the first oxide semiconductor film to the second oxide semiconductor film using the first oxide semiconductor film as a seed of the crystal growth, and the entire region of the second oxide semiconductor film is crystallized. Thus, the oxide semiconductor layer 403a can be formed using an oxide semiconductor film including a crystalline region having a large thickness.

Next, a second conductive film is formed over the insulating layer 402a and the oxide semiconductor layer 403a.

As the second conductive film, a film of a metal material such as aluminum, chromium, copper, tantalum, titanium, molybdenum, or tungsten, or an alloy material which contains any of the metal materials as a main component can be used, for example. The second conductive film can also be formed by stacking films of materials which can be applied to the second conductive film.

Figure 9A:
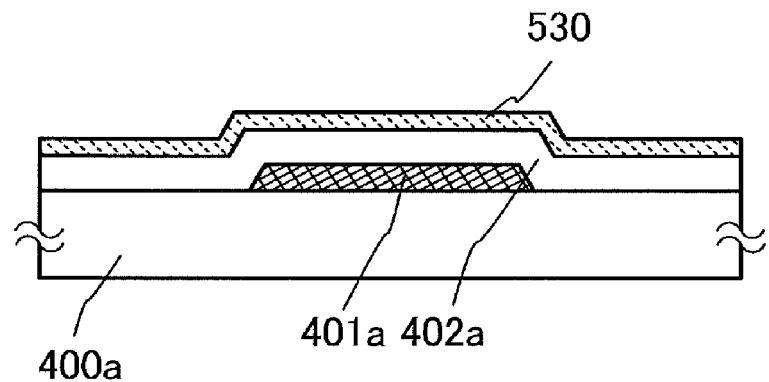
FIGS. 9A to 9C are cross-sectional schematic views illustrating a method for manufacturing the transistor illustrated in FIG. 8A.
Figure 9B:
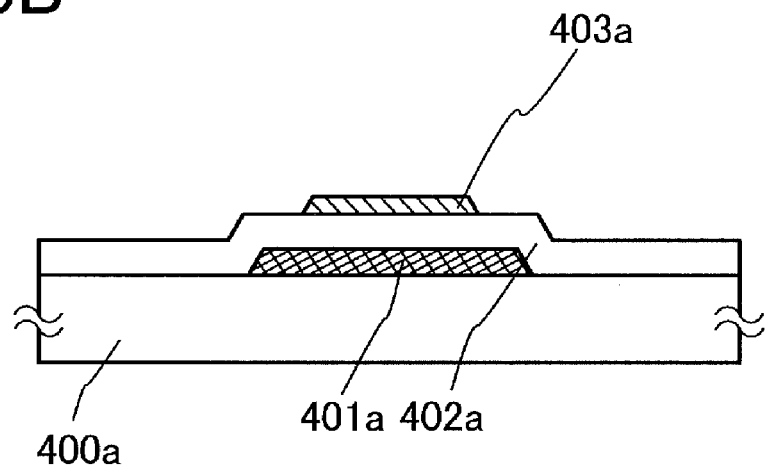
Figure 9C:
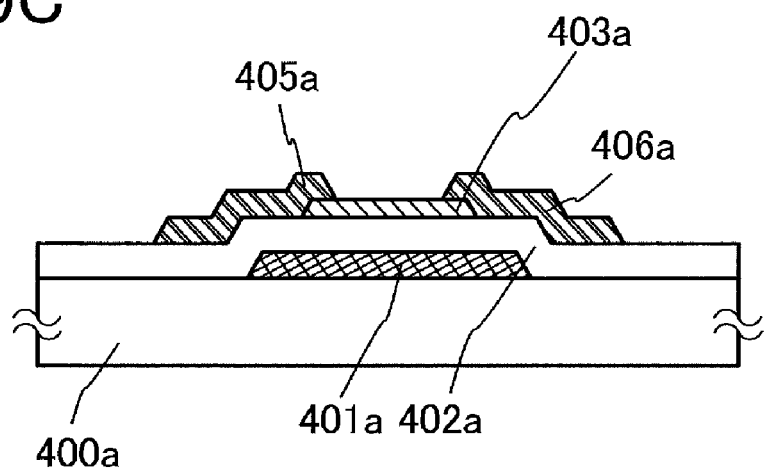

Next, a third photolithography process is carried out: a third resist mask is formed over the second conductive film, the second conductive film is selectively etched with the use of the third resist mask to form the conductive layer 405a and the conductive layer 406a, and the third resist mask is removed (see FIG. 9C).

Note that another wiring may be formed using the second conductive film at the time of forming the conductive layer 405a and the conductive layer 406a.

In light exposure in forming the third resist mask, ultraviolet light, KrF laser light, or ArF laser light is preferably used. A channel length L of the transistor to be completed later depends on the width of an interval between bottom ends of the conductive layers 405a and 406a which are adjacent to each other over the oxide semiconductor layer 403a. In the case where the channel length L is less than 25 nm, the light exposure is preferably performed using extreme ultraviolet light having an extremely short wavelength of several nanometers to several tens of nanometers in forming the third resist mask. In the light exposure with extreme ultraviolet light, the resolution is high and the focus depth is large. Therefore, the channel length L of the transistor to be completed later can be made greater than or equal to 10 nm and less than or equal to 1000 nm, and the use of the transistor formed through such light exposure enables higher speed operation of a circuit. In addition, the off-state current of the transistor is extremely small, which results in a reduction in power consumption.

In the case of etching the second conductive film, etching conditions are preferably optimized in order to prevent the oxide semiconductor layer 403a from being divided by the etching. However, it is difficult to set conditions under which only the second conductive film can be etched and the oxide semiconductor layer 403a is not etched at all. In some cases, part of the oxide semiconductor layer 403a is etched at the time of etching the second conductive film, so that the oxide semiconductor layer 403a comes to include a groove portion (depression portion).

In this embodiment, a titanium film is used as an example of the second conductive film, an In—Ga—Zn—O-based oxide semiconductor is used as an example of the oxide semiconductor layer 403a, and an ammonia hydrogen peroxide mixture (a mixed solution of ammonia, water, and hydrogen peroxide) is used as an etchant.

Next, the oxide insulating layer 407a is formed over the oxide semiconductor layer 403a, the conductive layer 405a, and the conductive layer 406a. Here, the oxide insulating layer 407a is in contact with part of the upper surface of the oxide semiconductor layer 403a.

The oxide insulating layer 407a can be formed to a thickness of at least 1 nm using a method by which impurities such as water or hydrogen are not introduced into the oxide insulating layer 407a, such as a sputtering method, as appropriate. When hydrogen is contained in the oxide insulating layer 407a, entry of the hydrogen to the oxide semiconductor layer, or extraction of oxygen in the oxide semiconductor layer by the hydrogen is caused, thereby causing the back channel of the oxide semiconductor layer to have lower resistance (to have an n-type conductivity), so that a parasitic channel might be formed. Therefore, in order to form the oxide insulating layer 407a containing as little hydrogen as possible, it is preferable that a method in which hydrogen is not used be employed as a method for forming the oxide insulating layer 407a.

In this embodiment, as an example of the oxide insulating layer 407a, a silicon oxide film having a thickness of 200 nm is formed by a sputtering method. The substrate temperature at the time of the film formation may be higher than or equal to room temperature and lower than or equal to 300° C.; in this embodiment, the substrate temperature is set to 100° C. as an example. The silicon oxide film can be formed by a sputtering method under a rare gas (typically, argon) atmosphere, an oxygen atmosphere, or a mixed atmosphere of a rare gas and oxygen.

Further, a silicon oxide target or a silicon target can be used as a target for forming the oxide insulating layer 407a. For example, with the use of a silicon target, a silicon oxide film can be formed by a sputtering method under an atmosphere containing oxygen.

As a sputtering gas used for forming the oxide semiconductor layer 407a, for example, a high-purity gas from which an impurity such as hydrogen, water, hydroxyl groups, or hydride is removed is preferably used.

Before formation of the oxide insulating layer 407a, plasma treatment with the use of a gas such as $N_2O$, $N_2$, or Ar may be performed to remove water or the like adsorbed on an exposed surface of the oxide semiconductor layer 403a. In the case where plasma treatment is performed, the oxide insulating layer 407a which is in contact with part of the upper surface of the oxide semiconductor layer 403a is preferably formed without exposure to the air.

Then, second heat treatment (preferably, at a temperature higher than or equal to 200° C. and lower than or equal to 400° C., for example, higher than or equal to 250° C. and lower than or equal to 350° C.) can be performed in an inert gas atmosphere or in an oxygen gas atmosphere. For example, the second heat treatment is performed at 250° C. in a nitrogen atmosphere for one hour. By the second heat treatment, heat is applied while part of the upper surface of the oxide semiconductor layer 403a is in contact with the oxide insulating layer 407a.

Through the above-described process, an impurity such as hydrogen, moisture, hydroxyl groups, or hydride (also referred to as a hydrogen compound) can be intentionally removed from the oxide semiconductor layer, and in addition, oxygen can be supplied to the oxide semiconductor layer. Therefore, the oxide semiconductor layer is highly purified.

Figure 10A:
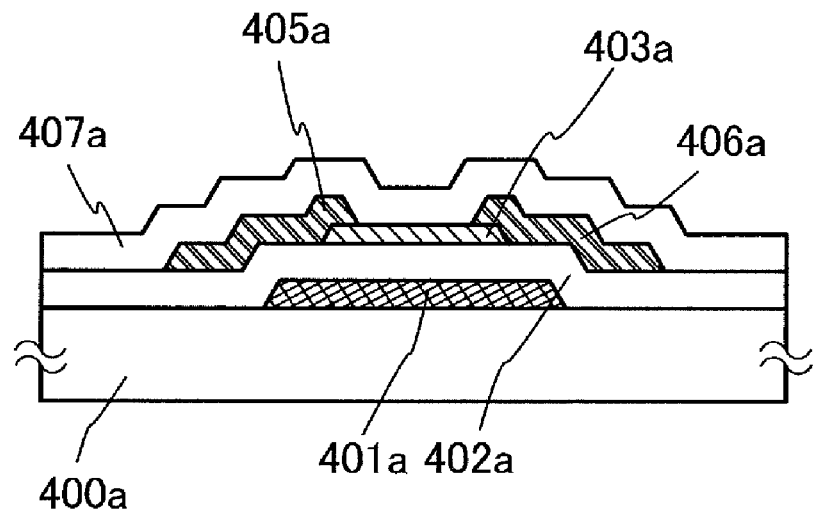
FIGS. 10A and 10B are cross-sectional schematic views illustrating a method for manufacturing the transistor illustrated in FIG. 8A.
Figure 10B:
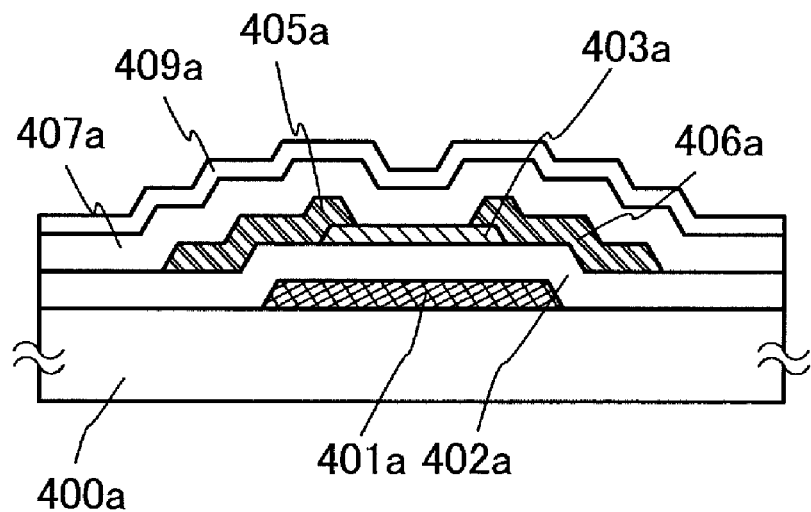

Through the above-described process, the transistor is formed (see FIG. 10A).

When a silicon oxide layer having many defects is used as the oxide insulating layer 407a, the heat treatment after formation of the silicon oxide layer has an effect of diffusing an impurity such as hydrogen, moisture, hydroxyl groups, or hydride contained in the oxide semiconductor layer 403a to the oxide insulating layer 407a, so that the impurity contained in the oxide semiconductor layer 403a can be further reduced.

Further, the protective insulating layer 409a may be formed over the oxide insulating layer 407a. For example, a silicon nitride film is formed by an RF sputtering method. The RF sputtering method is preferably used as a formation method of the protective insulating layer 409a because it achieves high mass productivity. In this embodiment, as an example, a silicon nitride film is formed as the protective insulating layer 409a (see FIG. 10B).

In this embodiment, the protective insulating layer 409a is formed in such a manner that the substrate 400a over which layers up to the oxide insulating layer 407a are formed is heated at a temperature of 100° C. to 400° C., a sputtering gas containing high-purity nitrogen from which hydrogen and moisture are removed is introduced, and a silicon nitride film is formed with the use of a target of a silicon semiconductor. In this case also, the protective insulating layer 409a is preferably formed while moisture remaining in a treatment chamber is removed, similarly to the oxide insulating layer 407a.

After formation of the protective insulating layer 409a, heat treatment may be further performed at a temperature higher than or equal to 100° C. and lower than or equal to 200° C. under the air for longer than or equal to 1 hour and shorter than or equal to 30 hours. This heat treatment may be performed at a fixed heating temperature. Alternatively, the following change in the heating temperature may be conducted plural times repeatedly: the heating temperature is increased from room temperature to a temperature higher than or equal to 100° C. and lower than or equal to 200° C. and then decreased to room temperature. That is an example of the method for manufacturing the transistor illustrated in FIG. 8A.

Although an example of the method for manufacturing the transistor illustrated in FIG. 8A is described, the present invention is not limited thereto. For example as for the components of FIGS. 8B to 8D which have the same designations as the components of FIG. 8A and whose function is at least partly the same as that of the components of FIG. 8A, description of the example of the manufacturing method of the transistor illustrated in FIG. 8A can be referred to as appropriate.

As described above, the transistor including an oxide semiconductor layer, which can be applied to any of the divider circuits described in the above embodiments, is a transistor including an oxide semiconductor layer as a channel formation layer. The oxide semiconductor layer used in the transistor is highly purified by heat treatment and thus becomes an i-type or substantially i-type oxide semiconductor layer.

The highly-purified oxide semiconductor layer includes extremely few (close to 0) carriers. The carrier concentration of the oxide semiconductor layer is less than $1\times10^{14}/cm^3$, preferably less than $1\times10^{12}/cm^3$, and more preferably less than $1\times10^{11}/cm^3$. Accordingly, the off-state current per micrometer of channel width can be 10 aA ($1\times10^{-17}$ A) or less, 1 aA ($1\times10^{-18}$ A) or less, 10 zA ($1\times10^{-20}$ A) or less, and further 1 zA ($1\times10^{-21}$ A) or less.

Further, with the use of the above transistor, breakdown voltage of the divider circuit can be improved, for example. In the divider circuit of this embodiment, voltage which is higher than or equal to power supply voltage is applied between a gate and a source of a transistor or between a gate and a drain of a transistor in some cases; therefore, it is preferable to use the transistor of this embodiment, which has high breakdown voltage.

Embodiment 5

In this embodiment, a semiconductor device including any of the divider circuits of the above embodiments will be described.

As the semiconductor device of this embodiment, a display device, a wireless communication device, an integrated circuit, or the like can be given, for example. As an example of a display device, a liquid crystal display device, an electroluminescent display device (also referred to as an EL display device), or the like can be given. As an example of a wireless communication device, an RFID (radio frequency identification) tag can be given. The RFID tag is also referred to as an RF tag, a wireless tag, an electronic tag, or a wireless chip.

Figure 11:
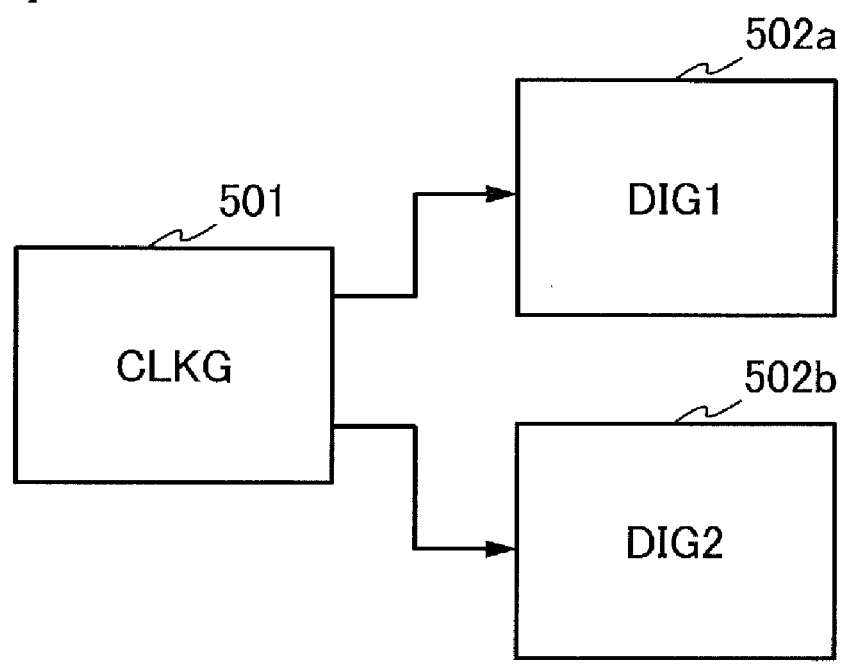
FIG. 11 is a block diagram illustrating an example of a structure of a semiconductor device in Embodiment 5.

An example of a structure of the semiconductor device of this embodiment will be described with reference to FIG. 11. FIG. 11 is a block diagram showing an example of a structure of the semiconductor device of this embodiment.

The semiconductor device illustrated in FIG. 11 includes a clock signal generation circuit (also referred to as CLKG) 501, a first digital circuit 502a (also referred to as DIG1), and a second digital circuit 502b (also referred to as DIG2).

The clock signal generation circuit 501 has a function of outputting a first clock signal and a second clock signal. The clock signal generation circuit 501 is provided with an oscillator circuit and a divider circuit. Any of the divider circuits of the above embodiments can be used as the divider circuit of this embodiment. Note that a cycle of the first clock signal and a cycle of the second clock signal are different from each other, and the cycle of the second clock signal is N times longer than the cycle of the first clock signal.

The first clock signal generated in the clock signal generation circuit 501 is input to the first digital circuit 502a. The first digital circuit 502a has a function of performing arithmetic processing using the clock signal. A circuit including a shift register, a flip-flop, a logic circuit, or the like can be given as an example of the first digital circuit 502a.

The second clock signal generated in the clock signal generation circuit 501 is input to the second digital circuit 502b. The second digital circuit 502b has a function of performing arithmetic processing using the clock signal. A circuit including a shift register, a flip-flop, a logic circuit, or the like can be given as an example of the second digital circuit 502b.

As described above, the semiconductor device of this embodiment includes a divider circuit in a clock signal generation circuit. With such a structure, even in the case where a plurality of digital circuits each of which is driven by a clock signal with a different cycle is provided, each of the digital circuits can operate.

This application is based on Japanese Patent Application serial no. 2010-090296 filed with Japan Patent Office on Apr. 9, 2010, the entire contents of which are hereby incorporated by reference.

The invention claimed is:

1. A divider circuit comprising:
a shift register configured to output 2X pulse signals in accordance with a first clock signal and a second clock signal, wherein X is a natural number greater than or equal to 2; and
a divided signal output circuit configured to output a third clock signal with a cycle X times longer than a cycle of the first clock signal in accordance with the 2X pulse signals,
wherein the divided signal output circuit comprises:
X first transistors each having a source, a drain, and a gate,
wherein the shift register is configured to separately supply the respective gates of the X first transistors with the first to X-th pulse signals among the 2X pulse signals, and
wherein the X first transistors are configured to control whether voltage of a signal to be the third clock signal is set to first voltage; and
X second transistors each having a source, a drain, and a gate,
wherein the shift register is configured to separately supply the respective gates of the X second transistors with (X+1)-th to 2X-th pulse signals among the 2X pulse signals, and wherein the X second transistors are configured to control whether voltage of a signal to be the third clock signal is set to second voltage.

2. The divider circuit according to claim 1,
wherein the shift register comprises sequential circuits of 2X stages,
wherein sequential circuits of odd-numbered stage in the 2X stages each comprise a third transistor which controls whether voltage of a pulse signal is set to voltage having a value depending on the first clock signal, and
wherein sequential circuits of even-numbered stage in the 2X stages each comprise a fourth transistor which controls whether the voltage of a pulse signal is set to voltage having a value depending on the second clock signal.

3. The divider circuit according to claim 1,
wherein a value of voltage of at least part of the 2X pulse signals is higher than or equal to power supply voltage.

4. The divider circuit according to claim 1,
wherein the X first transistors and the X second transistors each comprise an oxide semiconductor layer serving as a channel formation layer, and
wherein a band gap of the oxide semiconductor layer is 2 eV or more.

5. The divider circuit according to claim 1,
wherein the first clock signal and the second clock signal are clock signals whose waveforms are different from each other by a ½ cycle.

6. A clock signal generation circuit comprising:
an oscillator; and
the divider circuit according to claim 1.

7. A divider circuit comprising:
a first unit divider circuit configured to generate a third clock signal in accordance with a first clock signal and a second clock signal, wherein a cycle of the third clock signal is X times longer than a cycle of the first clock signal, and wherein X is a natural number greater than or equal to 2; and
a second unit divider circuit configured to generate a fourth clock signal in accordance with the third clock signal, wherein a cycle of the fourth clock signal is a cycle K times longer than the cycle of the third clock signal, and wherein K is a natural number greater than or equal to 2,
wherein the first unit divider circuit comprises:
a shift register configured to output 2X pulse signals in accordance with the first clock signal and the second clock signal; and
a divided signal output circuit configured to output the third clock signal in accordance with the 2X pulse signals,
wherein the divided signal output circuit comprises:
X first transistors each having a source, a drain, and a gate,
wherein the shift register is configured to separately supply the respective gates of the X first transistors with the first to X-th pulse signals among the 2X pulse signals, and
wherein the X first transistors are configured to control whether voltage of a signal to be the third clock signal is set to first voltage; and
X second transistors each having a source, a drain, and a gate,
wherein the shift register is configured to separately supply the respective gates of the X second transistors with (X+1)-th to 2X-th pulse signals among the 2X pulse signals, and
wherein the X second transistors are configured to control whether voltage of a signal to be the third clock signal is set to second voltage.

8. The divider circuit according to claim 7,
wherein the shift register comprises sequential circuits of 2X stages,
wherein sequential circuits of odd-numbered stage in the 2X stages each comprise a third transistor which controls whether voltage of a pulse signal is set to voltage having a value depending on the first clock signal, and
wherein sequential circuits of even-numbered stage in the 2X stages each comprise a fourth transistor which controls whether the voltage of a pulse signal is set to voltage having a value depending on the second clock signal.

9. The divider circuit according to claim 7,
wherein a value of voltage of at least part of the 2X pulse signals is higher than or equal to power supply voltage.

10. The divider circuit according to claim 7,
wherein the X first transistors and the X second transistors each comprise an oxide semiconductor layer serving as a channel formation layer, and
wherein a band gap of the oxide semiconductor layer is 2 eV or more.

11. The divider circuit according to claim 7,
wherein the first clock signal and the second clock signal are clock signals whose waveforms are different from each other by a ½ cycle.

12. A clock signal generation circuit comprising:
an oscillator; and
the divider circuit according to claim 7.

13. A divider circuit comprising:
a shift register configured to output a plurality of pulse signals comprising a first pulse signal, a second pulse signal, a third pulse signal, and a fourth pulse signal in accordance with a first clock signal and a second clock signal; and
a divided signal output circuit configured to output a third clock signal with a cycle X times longer than a cycle of the first clock signal in accordance with the plurality of pulse signals, wherein X is a natural number greater than or equal to 2,
wherein the divided signal output circuit comprises:
a plurality of first transistors configured to control whether voltage of a signal to be the third clock signal is set to first voltage, the plurality of first transistors comprising at least two transistors; and
a plurality of second transistors configured to control whether voltage of a signal to be the third clock signal is set to second voltage, the plurality of second transistors comprising at least two transistors,
wherein the shift register is configured to supply a gate of one of the two transistors comprised in the plurality of first transistors with one of the first pulse signal and the second pulse signal,
wherein the shift register is configured to supply a gate of the other of the two transistors comprised in the plurality of first transistors with the other of the first pulse signal and the second pulse signal,
wherein the shift register is configured to supply a gate of one of the two transistors comprised in the plurality of second transistors with one of the third pulse signal and the fourth pulse signal, and
wherein the shift register is configured to supply a gate of the other of the two transistors comprised in the plurality of second transistors with the other of the third pulse signal and the fourth pulse signal.

14. The divider circuit according to claim 13,
wherein the plurality of pulse signals comprise 2X pulse signals.

15. The divider circuit according to claim 14,
wherein the plurality of first transistors comprise X transistors, and
wherein the plurality of second transistors comprise X transistors.

16. The divider circuit according to claim 13,
wherein the plurality of first transistors and the plurality of second transistors each comprise an oxide semiconductor layer serving as a channel formation layer, and
wherein a band gap of the oxide semiconductor layer is 2 eV or more.

17. The divider circuit according to claim 13,
wherein the shift register comprises sequential circuits of 2X stages,
wherein sequential circuits of odd-numbered stage in the 2X stages each comprise a third transistor which controls whether voltage of a pulse signal is set to voltage having a value depending on the first clock signal, and
wherein sequential circuits of even-numbered stage in the 2X stages each comprise a fourth transistor which controls whether the voltage of a pulse signal is set to voltage having a value depending on the second clock signal.

18. The divider circuit according to claim 13,
wherein a value of voltage of at least part of the 2X pulse signals is higher than or equal to power supply voltage.

19. The divider circuit according to claim 13,
wherein the first clock signal and the second clock signal are clock signals whose waveforms are different from each other by a ½ cycle.

20. A clock signal generation circuit comprising:
an oscillator; and
the divider circuit according to claim 13.

* * * * *